United States Patent
Mandelman et al.

(10) Patent No.: US 6,452,224 B1
(45) Date of Patent: Sep. 17, 2002

(54) METHOD FOR MANUFACTURE OF IMPROVED DEEP TRENCH EDRAM CAPACITOR AND STRUCTURE PRODUCED THEREBY

(75) Inventors: Jack A. Mandelman, Stormville, NY (US); Carl J. Radens, LaGrangeville, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/910,981

(22) Filed: Jul. 23, 2001

(51) Int. Cl.[7] .................. H01L 29/94; H01L 29/76; H01L 31/062; H01L 31/113; H01L 31/119
(52) U.S. Cl. ............... 257/296; 257/301; 257/303; 257/306
(58) Field of Search ............... 257/296, 301, 257/303, 304, 306, 311

(56) References Cited

U.S. PATENT DOCUMENTS 5,831,301 A * 11/1998 Horak et al. ............... 257/302
6,335,239 B1 * 1/2002 Agahi et al. ............... 438/245
6,368,912 B1 * 4/2002 Chang et al. ............... 438/248

* cited by examiner

Primary Examiner—Eddie Lee
Assistant Examiner—Jesse A. Fenty
(74) Attorney, Agent, or Firm—Graham S. Jones, II; H. Daniel Schnurmann

(57) ABSTRACT

A capacitor is formed in a trench in a well/substrate doped with a first polarity. A dielectric isolation collar formed on trench sidewalls is recessed below the trench top and is spaced from the trench bottom. Therebelow, a counterdoped plate electrode region surrounds the trench and a node dielectric covers the exposed sidewalls. A counterdoped conductive buffer layer or region covers the node dielectric. A conductive, lower diffusion barrier covers the buffer. A first polarity doped node conductor, which is formed over the lower diffusion barrier, is covered by a conductive, upper diffusion barrier. A counterdoped cap covers the upper diffusion barrier. A counterdoped strap region formed by outdiffusion into the substrate is juxtaposed with the edge of the cap.

51 Claims, 23 Drawing Sheets

METHOD FOR MANUFACTURE OF IMPROVED DEEP TRENCH EDRAM CAPACITOR AND STRUCTURE PRODUCED THEREBY

BACKGROUND OF THE INVENTION

1. Field of the Invention

This invention relates to integrated circuit devices and more particularly to deep trench capacitors and methods of manufacture thereof.

2. Description of Related Art

Currently, Deep Trench (DT) capacitor technology suffers from several problems which limit scalability. Some of those problems are listed as follows:

(1) the excessive resistance of the DT fill which forms the inner capacitor plate reduces the effectiveness of the DT capacitor;

(2) the adverse effect of the work function of the DT fill of the inner capacitor node electrode on the reliability of the node dielectric;

(3) the vertical parasitic (non-scalability of the thickness of the isolation collar oxide effects the choice of DT fill work function and DT operating biases on vertical parasitic).

In the past, problems of resistance of DT fill have been dealt with without regard to other deep trench capacitor scaling problems. In such cases one solution proposed was to solve to the deep trench resistance problem, without seeking a reduction in the thickness of the collar oxide at a time frame when increasing the collar thickness was not a concern because the minimum feature size used was sufficiently large.

SUMMARY OF THE INVENTION

An object of this invention is to provide an improved DT capacitor structure, and methods for fabrication, which reduces capacitor electrode series resistance.

Another object of this invention is to provide an improved DT capacitor structure, and methods for fabrication, which minimizes the electric field stress for the node dielectric.

Still another object of this invention is to provide an improved DT capacitor structure, and methods for fabrication, which allows thinner collar isolation oxide without degrading the vertical parasitic Vt.

Another object of this invention is to provide an effective capacitor node work function which closely matches the work function of the buried, outer electrode (plate electrode), thereby allowing a level of plate bias voltage which will minimize electrical stress on the node dielectric layer between the outer electrode and the inner electrode, also referred to as the storage node or the node conductor, of the capacitor without degrading the vertical parasitic threshold voltage VT.

This invention provides an integrated solution to deep trench capacitor scaling. This integrated solution addresses not only the deep trench resistance problem, but also seeks an integrated solution for allowing thinner collar and minimizing node dielectric stress.

In accordance with this invention, a device and method of forming the device comprising a deep trench capacitor is provided. An open top deep trench if formed with sidewalls and a bottom formed in a semiconductor substrate which is doped with a dopant of a first polarity by the following steps. Form an isolation collar recessed below the top and spaced away from the bottom, composed of a thin film of a dielectric material with confronting sides of the isolation collar formed along the sidewalls of the trench in a space intermediate the top and the bottom of the deep trench. Form a plate electrode region of the substrate surrounding the trench below the isolation collar by counterdoping the plate electrode region through the sidewalls and the bottom with a dopant of the opposite polarity. Form a node dielectric for the capacitor therewith on the exposed sidewalls and exposed bottom of the deep trench thereby covering exposed surfaces of the plate electrode. Form a buffer on the surface of the node dielectric comprising polysilicon doped with a dopant of the opposite polarity. Form a conductive lower diffusion barrier layer over the buffer. Form a bulk inner electrode on the surface of the lower diffusion barrier layer the bulk inner electrode being composed of polysilicon which is doped with a dopant of first polarity. Form a conductive upper diffusion barrier layer over the bulk inner electrode reaching between confronting sides of the isolation collar. Form a polysilicon cap on the surface of the conductive upper diffusion barrier layer with a strap formed on the periphery thereof the polysilicon cap being doped with a dopant of the opposite polarity. Form a strap region by diffusion of dopant of the opposite polarity into a region in the substrate juxtaposed with the periphery of the polysilicon cap. The buffer layer composed of polysilicon doped with a dopant matching the polarity of the outer electrode provides a work function which closely matches the work function of the outer electrode thereby allowing a plate bias of 0.75V with a zero to 1.5V swing on the bulk inner electrode for minimized stress on the node dielectric layer without degrading the vertical parasitic threshold voltage VT.

Preferably, the substrate comprises a doped silicon chip and the buffer region the bulk inner electrode and the cap all comprise doped polysilicon Preferably, the substrate comprises a doped silicon chip and the buffer region the plate electrode and the cap all comprise doped polysilicon and Preferably, each of the lower and upper diffusion barrier layer are composed of a material selected from the group consisting of TiN and WN.

Preferably, the substrate comprises a doped silicon chip and the buffer region the bulk inner electrode and the cap all comprise doped polysilicon. Form each of the lower and upper diffusion barrier layers of a material selected from the group consisting of TiN and WN. Form a blanket thin film of the upper diffusion barrier covering the node conductor and the upper portion of the isolation collar. Form a silicon oxide layer on the horizontal surfaces of the upper diffusion barrier including the portion above the bulk inner electrode, and etch away the vertical surfaces of the upper diffusion layer. Form the silicon oxide layer by a method selected from the group consisting of the step of a) Form HDP oxide in an anisotropic deposition of a horizontal layer, and b) Form a recessed mandrel above the upper diffusion barrier.

Preferably, the substrate comprises a doped silicon chip and the buffer region the bulk inner electrode and the cap all comprise doped polysilicon. Form each of the lower and upper diffusion barrier layers of a material selected from the group consisting of TiN and WN. Form a blanket thin film of the upper diffusion barrier covering the bulk inner electrode and the upper portion of the isolation collar. Form a silicon oxide layer on the horizontal surfaces of the upper diffusion barrier including the portion above the bulk inner electrode. Etch away the vertical surfaces of the upper diffusion layer. Form the cap on the surface of the upper diffusion layer.

Preferably, the substrate comprises a doped silicon chip and the buffer region the bulk inner electrode and the cap all comprise doped polysilicon. Form each of the lower and upper diffusion barrier layers of a material selected from the group consisting of TiN and WN. Form a blanket thin film of the upper diffusion barrier covering the bulk inner electrode and the upper portion of the isolation collar. Form a silicon oxide layer on the horizontal surfaces of the upper diffusion barrier including the portion above the bulk inner electrode. Etch away the vertical surfaces of the upper diffusion layer. Form a very thin layer of silicon nitride on the exposed surfaces of the sidewalls. Form the cap on the surface of the upper diffusion layer in contact with the very thin layer of silicon nitride. Form pad mask over the substrate with an opening for etching the trench. Form the trench etching through the opening. Form the isolation collar to the top of the pad mask.

In accordance with another aspect of the invention, form a pad mask over the substrate with an opening for etching the trench. Form the trench by etching through the opening. Form the isolation collar to the top of the substrate. Form the buffer region and the lower diffusion layer; form the bulk inner electrode and recess the plate electrode. Form sidewall spacers alongside the isolation collar above the bulk inner electrode; form the upper diffusion barrier as a blanket layer; mask the horizontal surfaces of the upper diffusion barrier and etch away the vertical part of the upper diffusion barrier; and strip away the sidewall spacers. Deposit and recess the cap; and etch away exposed portions of the upper diffusion barrier.

Preferably, form the capacitor in a P-well; form the plate by doping with N+ dopant; form the buffer region as a thin layer of polysilicon doped with N+ dopant form the node conductor of the polysilicon doped with P type dopant and layer, and form the cap of the N+ doped polysilicon.

DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1:
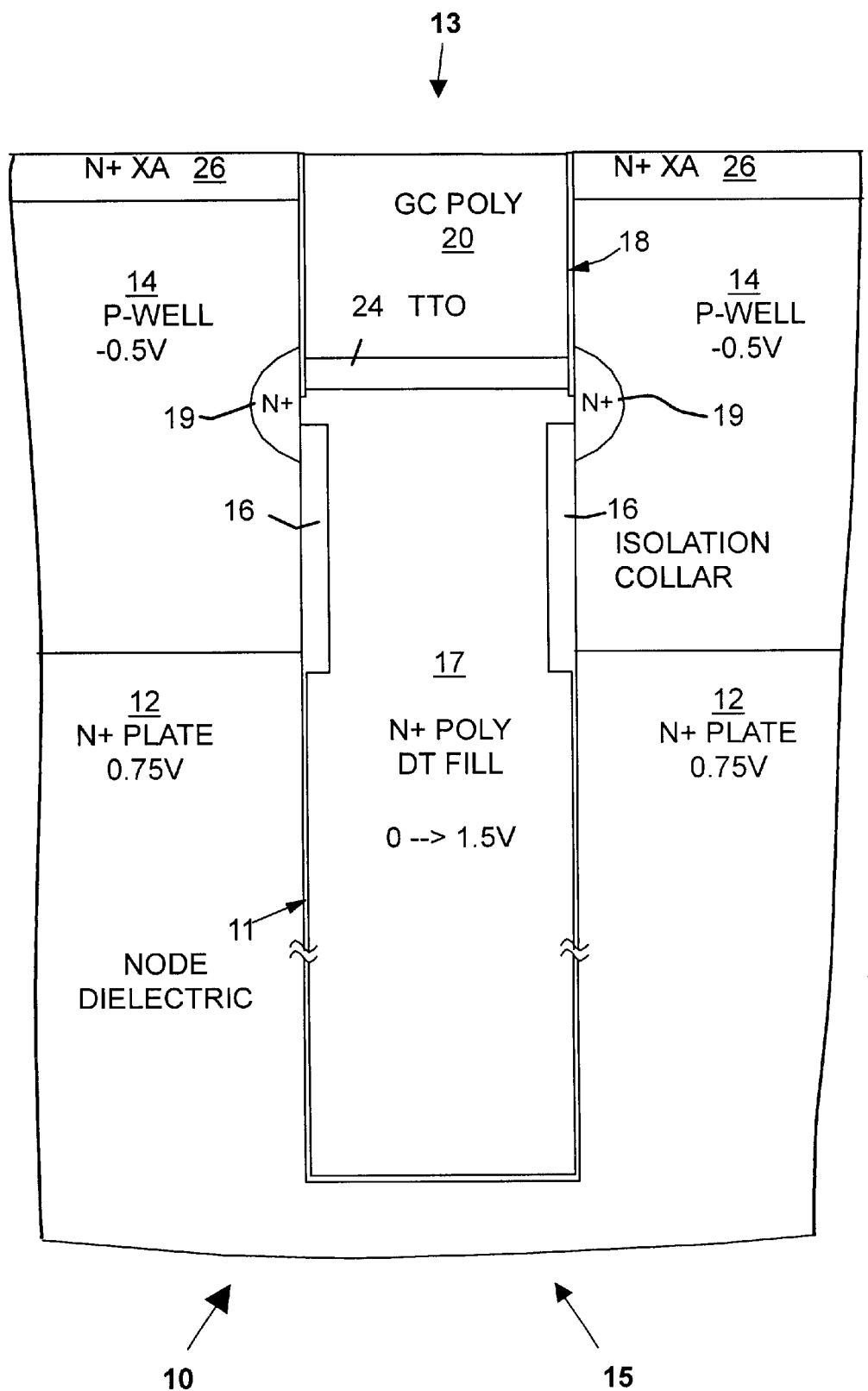
FIG. 1 shows a hypothetical, vertical N-channel MOSFET embodiment of a DT capacitor which is provided to illustrate problems solved by this invention.

FIG. 1 is a sectional schematic diagram showing a hypothetical, vertical, N-channel MOSFET embodiment of a deep trench capacitor 10, which illustrates certain problems solved by the present invention. In FIG. 1, a deep trench capacitor 10 has been formed in a deep trench (DT) 13 in a doped semiconductor substrate 15 with an N+ doped buried electrode comprising the buried, outer electrode 12 (N+ plate) of the capacitor 10.

The outer electrode 12 (N+ plate) surrounds the lower portions and the bottom of the deep trench 13. The inner electrode 17 of the capacitor 10 is also referred to herein as the storage node or the node conductor. The inner electrode 17 comprises a plug composed of N+ doped polysilicon deep trench fill, which completely fills the of the lower portion of the deep trench 13.

A node dielectric layer 11 (composite of silicon oxide and silicon nitride) is formed on the inner wall of the outer electrode 12, i.e. the wall of trench 13 between the inner electrode 17 and outer electrode 12. A P-well 14, which is formed in the substrate 15 above the outer electrode 12, is shown surrounding the upper portion of the deep trench 13. An isolation collar 16, which was formed on the wall of the DT 13 before the inner electrode 17 was formed, extends up from near to top of the outer electrode 12 (just below the bottom of the P-well 14) to just below the top of the inner electrode 17.

Above the collar 16, the top portion of the inner electrode 17 is exposed to a portion of an N+ doped strap region 19 which is formed in the P-well 14. The N+ doped region also defines a first source/drain diffusion of the vertical MOSFET. The strap region 19 is juxtaposed with the edges of the deep trench 13 and it is exposed to direct electrical and mechanical contact with the upper portion of the inner electrode 17. The strap region 19 was formed by outdiffusion from the inner electrode 17 into the P-well 14 of some of the N+ dopant from N+ doped, polysilicon fill from the inner electrode 17.

On the sidewalls of the deep trench 13, spaced above the isolation collar 16, a thin layer of a gate oxide layer 18 is formed. The gate oxide layer 18 reaches to the top of the deep trench 13. There is a partial overlap of the center of the strap 19 with the gate oxide layer 18. Above the inner electrode 17 and inside the gate oxide layer 18, the deep trench 13 is partially filled with a thinner Trench Top Oxide (TTO) layer 24. Above the TTO layer 24 and also inside the gate oxide layer 18, the deep trench 13 is filled to the top with a Gate Conductor (GC) 20 comprising a doped polysilicon conductor, i.e the gate conductor 20 extends to the top of the deep trench 13. Thus, the gate oxide layer 18 is formed between the GC 20 and the P-well 14. Above the P-well 14 on the sides to the deep trench 13 is an N+ XA implant region 26 for NFET devices of the N channel device. The N+ XA implant region 26 defines the second source/drain diffusion of the vertical MOSFET. It should be noted that this description also applies to P channel devices and would differ as to the doping of the well 14, the outer electrode 12, the strap region 19, the inner electrode 17 and the implant region 26.

In the current state of the art, the embodiment shown in FIG. 1 will perform quite satisfactorily. However, as we look ahead to smaller and smaller dimensions as the state of the art advances to smaller feature parameters, there will be a problem with further use of an embodiment of the kind shown in FIG. 1 for the formation of a DT (Deep trench) capacitor 10 to be used for a DRAM (or eDRAM) cell employing a vertical channel MOSFET.

The problem can be understood after a description of the details of the hypothetical structure shown in FIG. 1, wherein the capacitor 10 is formed in a semiconductor substrate 15 in which a P-well 14 has been formed above the N+ doped outer electrode 12. Capacitor 10 includes the two capacitor plates comprising the inner electrode 17 and the outer buried plate 12 (also known as the counter electrode) which are separated by the intermediate, thin film, node dielectric layer 11.

Since the work function of the N+ inner electrode 17 and the N+ outer electrode 12 are closely matched, a bias of 0.75 Volts is used on the N+ outer electrode 12 to balance the voltage drop (stress) across the node dielectric layer 11. The maximum potential drop across the node dielectric layer 11 is 0.75V in each direction, when going from a stored zero "0" to a stored one "1". Because of the N+ polysilicon fill of the inner electrode 17, the isolation collar 16 is required to have a minimum thickness of about 25 nm of silicon oxide for the purpose of suppressing the vertical parasitic MOSFET device formed by the outer electrode 12, the N+ strap diffusion region 19, and the gating action of the N+ polysilicon fill of the inner electrode 17. The requirement that the device must have a 25 nm minimum collar oxide thickness severely limits scalability below a minimum feature size "F" equal to about 100 nm. That is true because, in such an embodiment, a large fraction of the DT cross-section is occupied by the isolation collar 16, leaving very little room for the DT fill of the N+ inner electrode 17 in the region of the isolation collar 16. Thus there is a need for a reduction of the thickness of the silicon oxide isolation collar 16 without degrading the operation of the device, i.e. increasing the vertical parasitic leakage.

Another concern is the electrical resistance of the N+ polysilicon fill of the inner electrode 17. For ground-rules below F=100 nm, (where F is the minimum feature size), the series resistance of the N+ polysilicon fill of the inner electrode 17 dominates the time constant for the charging and discharging of the storage capacitor 10 in FIG. 1.

In accordance with this invention, we have found that the above described problems can be overcome by enhancing the DT fill of the N+ inner electrode 17 with an inner electrode fill material having a significantly lower resistance than N+ doped polysilicon alone. However, introduction of lower resistance materials (e.g. TiN, WN, WSix, etc.) into the DT inner electrode 17 may alter the work function thereof. Mid-gap metal work functions may result in an unbalanced electrical stress across the node dielectric layer 11. Accordingly, a design which minimizes such effects has been provided in accordance with this invention for the purpose of avoiding that problem.

For example, with a mid-gap work function material of the inner electrode 17 (the storage node) and maintaining the plate voltage at 0.75V, the electrical stress across the node dielectric swings from +0.20 V (for a stored one "1") to −1.30 V (for a stored zero "0"). Thus, changing the work function of the conductor of the inner electrode 17 (the storage node) towards mid-gap results in a significant increase in maximum voltage stress seen by the capacitor dielectric layer 11. To rebalance and minimize the stress, the voltage bias on the outer electrode 12 may be decreased by an amount equal to the shift in work function of the conductor of the inner electrode 17 (the storage node) towards mid-gap, as long as the outer electrode 12 to substrate junction does not become forward biased. However, reduction of the voltage of the outer electrode 12 severely degrades the threshold voltage (VT) and the leakage current of the vertical parasitic MOSFET, since the back bias is reduced and the gate overdrive is now increased.

Thus, one must avoid reduction of voltage of the outer electrode 12 to minimize the stress on the node dielectric layer 11 because of consequences to the vertical parasitic device.

Therefore, a set of objects of this invention include providing an improved DT capacitor structure, and methods for fabrication, which as follows:

(1) reduce capacitor electrode series resistance, especially of the conductor of the inner electrode, (2) maintain a minimum stress condition for the node dielectric, and (3) allow a structure with a thinner collar isolation oxide without degrading the vertical parasitic Vt.

Figure 2A:
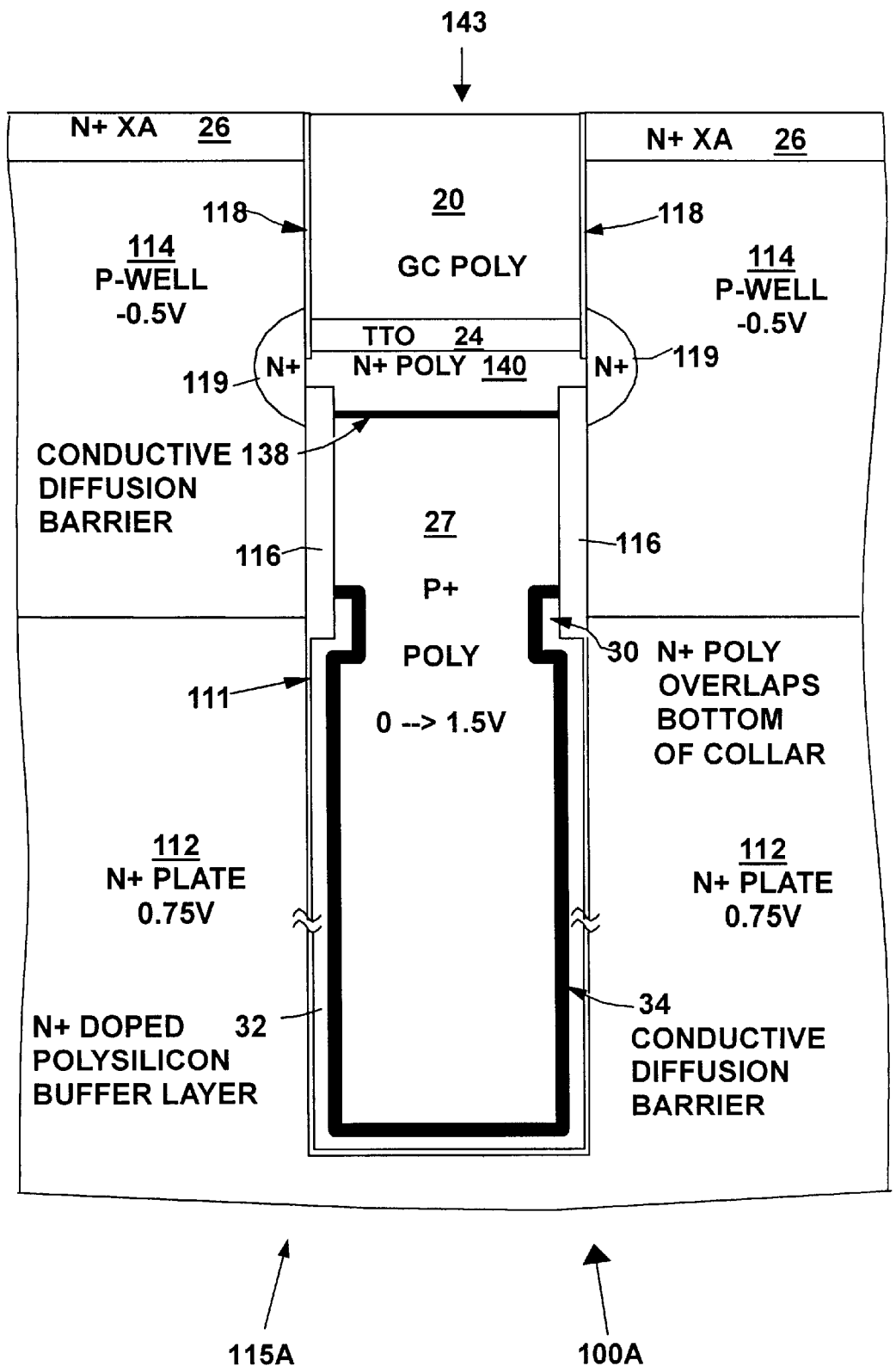
FIGS. 2A, 2B and 2C show three embodiments of a DT capacitors in accordance with this invention, which are modifications of the capacitor of FIG. 1.
Figure 2B:
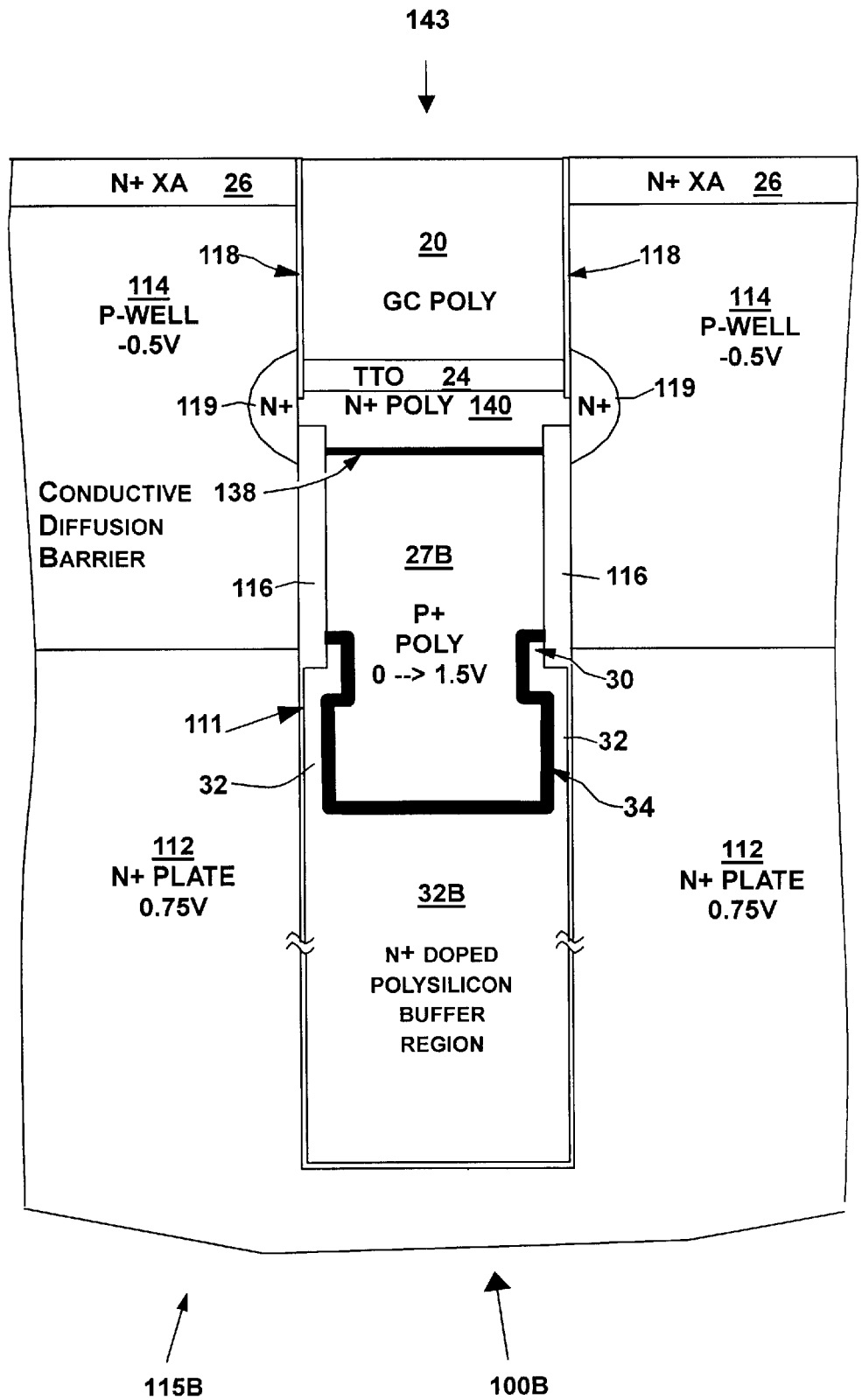
Figure 2C:
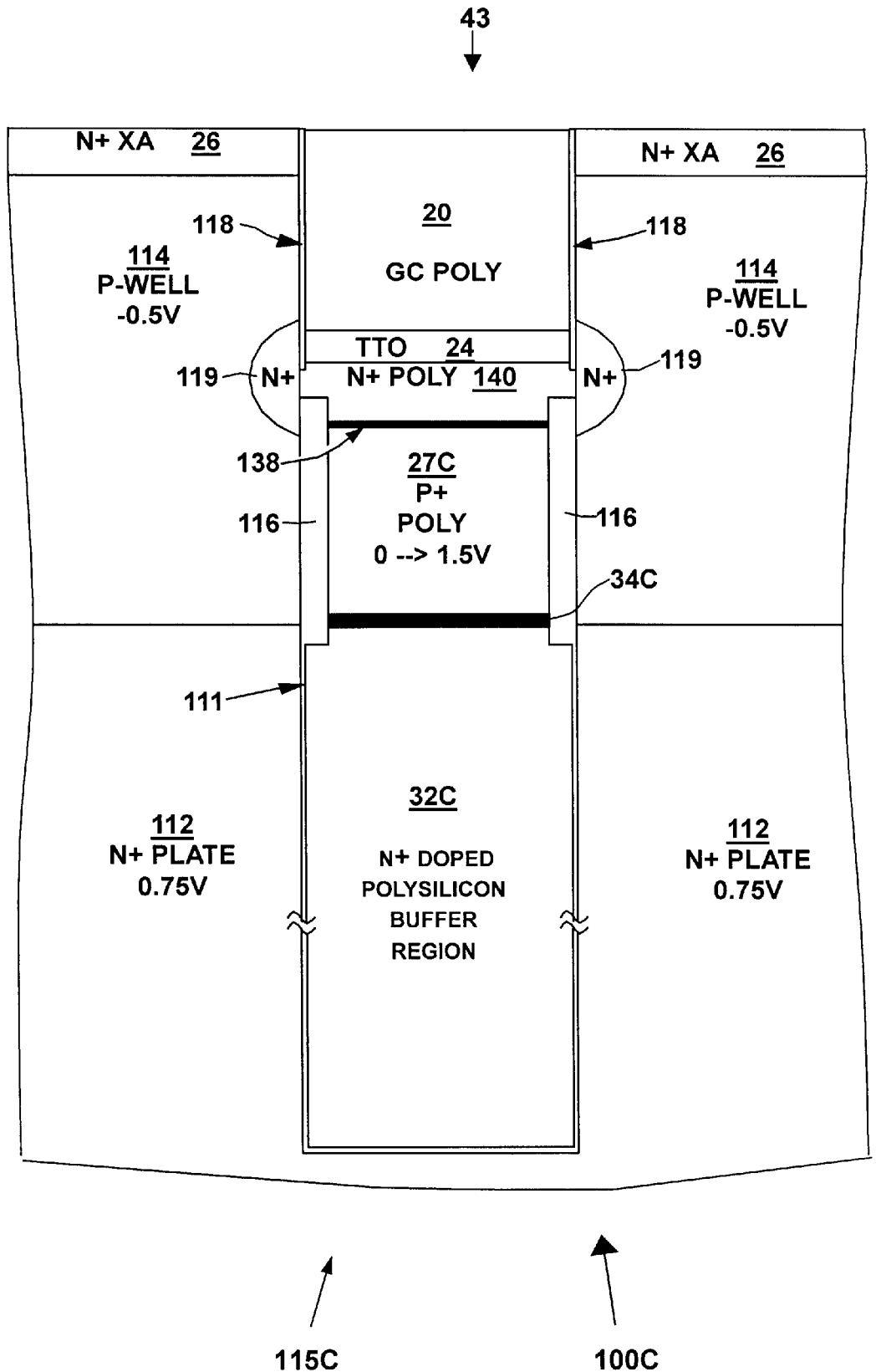

FIGS. 2A–2C show several cross-sectional view of embodiments of this invention which are deep trench capacitors 100A, 100B and 100C formed in a deep trench (DT) 143 in a doped semi-conductor substrate 115A, 115B and 115C that is an example of how the capacitor of FIG. 1 can be modified in accordance with the various aspects of the method this invention.

In FIG. 2A, the simple N+ doped inner electrode 17 of FIG. 1 has been replaced by a number of conductive elements. A first one of those conductive elements comprises an optional N+ doped buffer layer 32, a lower, highly conductive, diffusion barrier 34, a P+ polysilicon doped bulk inner electrode 27, an upper, highly conductive, diffusion barrier 138, isolation collar 116 and a N+ doped cap 140. It should be noted that as contrasted with FIG. 1, the P+ doped inner electrode 27 is doped oppositely with respect to the N+ doped buffer layer 32, the N+ doped outer electrode 112 and the N+ doped cap 140, since they are all N+ doped.

The isolation collar 116 of FIG. 2A, which is similar to the collar 16 of FIG. 1, extends from just below the bottom of the P-well 114 to well above the top of the P+ doped bulk inner electrode 27 and above the upper diffusion barrier 138 to near the middle of the cap 140. The lower end of the isolation collar 116 and the walls of the deep trench 143 below collar 116 are covered by an optional, thin, conductive, buffer layer 32 (e.g. an N+ polysilicon buffer layer), which in turn is covered by a highly conductive, lower diffusion barrier layer 34 (e.g. a material such as titanium nitride (TiN) or tungsten nitride (WN) and the like). The P+ doped, conductive, bulk, inner electrode 27, which partially fills the deep trench 143, does not reach to the level of the strap region 119 which is formed in the P-well 114. A thin film, conductive, upper diffusion barrier layer 138 is formed on the top surface of the bulk inner electrode 27.

In summary, the overall inner conductor of the capacitor 100A comprises the buffer layer 32, the lower diffusion barrier layer 34, the conductive bulk inner electrode 27, the upper diffusion barrier layer 138 and the cap 140.

The N+ doped polysilicon cap 140 is formed above the conductive diffusion barrier layer 138. As in FIG. 1, the N+ doped strap region 119, which is formed in the P-well 114, is juxtaposed with the edges of the N+ doped polysilicon cap 140 along the walls of the trench 143. A thin layer of gate oxide 118 is formed on the sidewalls of the deep trench 143 above the cap 140. There may be a partial overlap of the gate oxide layer 118 with the cap 140.

Above the cap 140 and inside the gate oxide layer 118, the deep trench 143 is partially filled with a Trench Top Oxide (TTO) layer 24. Above TTO layer 24 and also inside the gate oxide layer 118, the deep trench 143 is filled to the top with a Gate Conductor (GC) polysilicon layer 20 is formed, which extends to the top of the deep trench 143. Thus, the gate oxide layer 118 separates the GC polysilicon layer 20 and the P-well 114.

An N+ XA implant region 26 for NFET devices is formed above the P-well 114 on the sides to the deep trench 143.

The thin (<10 nm) buffer layer 32 is preferably composed of N+ polysilicon, that is formed on the inner surface of node dielectric layer 111. The buffer layer 32 also covers the lower end of the isolation collar 116 as well as the inner walls of the lower end of isolation collar 116. The N+ polysilicon buffer layer 32 provides a work function which closely matches the work function of the N+ outer electrode 112, thereby allowing a plate bias of 0.75V for minimized stress on the node dielectric layer 11 without degrading the vertical parasitic threshold voltage VT.

The lower diffusion barrier layer 34 (e.g. TiN, WN, etc.) is formed over the inner surface of the N+ polysilicon buffer layer 32 reaching over the top thereof into contact with the isolation collar 116. The highly conductive, lower, diffusion barrier layer 34 is made sufficiently thick (from about 10 nm to about 50 nm) to provide a significant reduction of the series resistance of the capacitor 100A. Calculations show that use of the highly conductive, lower, diffusion barrier layer 34 results in a two order magnitude reduction in DT series resistance from the lower portion of the DT capacitor 100A. Such a reduction is resistance means that the time constant associated with charging and discharging the capacitor 100A is no longer dominated by the DT fill 27 in the lower portion of the DT. An additional purpose of the lower, conductive diffusion barrier 34 is to prevent interdiffusion of N+ and P+ dopant within the deep trench 143 of the capacitor 100A.

Inside of the lower, conductive diffusion barrier layer 34, the remainder of the DT capacitor 100A is filled with the bulk inner electrode 27 (i.e. the bulk storage node) composed of P+ doped polysilicon, which has been planarized and recessed to a depth which is slightly below the N+ doped buried strap 119 (which was formed by outdiffusion from the N+ doped cap 140). This results in the P+ polysilicon bulk inner electrode 27 (storage node) serving as the gate of the vertical parasitic MOSFET. Therefore, the threshold voltage VT of the vertical parasitic MOSFET is increased by 1.1 Volts relative to the device of FIG. 1 for a constant thickness of the isolation collar 116. The P+ work function of the parasitic gate allows a reduction in the thickness of the isolation collar 116 without degrading the threshold voltage VT of the parasitic MOSFET with respect to the device of FIG. 1.

An upper region of the DT capacitor 100A is then formed with a conductive N+ polysilicon cap 140 to assure compatibility with the N+ strap outdiffusions. Once again, to prevent interdiffusion, an upper conductive diffusion barrier 138 is formed between the upper N+ polysilicon cap 140 and the P+ polysilicon of the bulk inner electrode 27 (storage node) below. The polysilicon cap 140 covers the upper inner wall and top surface of the isolation collar 116 and reaches into contact with the N+ strap region 119 formed in the P-well 114.

FIG. 2B shows modification of FIG. 2A in which a capacitor 100B includes a deep N+ doped fill region 32B formed in the lower portion of the trench 143 below the collar 116 and the shallower portion of the bulk inner electrode 27B in addition to the thin buffer layer 32B between the lower, conductive diffusion barrier layer 34B and the node dielectric 111. In this case the storage node comprises the bulk inner electrode 27B and the fill region 32B. The modified lower, conductive diffusion barrier layer 34B extends down into the trench 143 slightly below the isolation collar 116 and between the sides of trench 143, as seen in FIG. 2B. Note that it is important here that a thin neck of the N+ polysilicon buffer layer 32B overlaps the bottom of the collar 116, at buffer layer overlap region 30, to prevent damage to the node dielectric 111 from subsequent processing. In the embodiment of FIG. 2B, the series resistance is not reduced to the same extent as it is with the structure of the kind shown in FIG. 2A.

FIG. 2C shows another modification of FIG. 2A in which a capacitor 100C includes forming an N+ doped fill region 32C in lower portion of the trench below the collar 116 with a far shallower bulk inner electrode 27C. In this case also, the storage node comprises the bulk inner electrode 27C and the fill region 32C. The lower, conductive diffusion barrier layer 34C extends between the two sides of the isolation collar 116, and the layer 34C extends above the bottom of the isolation collar 116. Thus, the buffer layer overlap region 30 and the thin buffer layer 32C between the lower, conductive diffusion barrier layer 34C and the node dielectric 111 are omitted in this particular embodiment. The far shallower bulk inner portion of electrode 27C is located between the top and bottom surface of the isolation collar 116 and is sandwiched between the diffusion barrier layers 138/34C.

In the embodiment of FIG. 2C, there is substantially less reduction of series resistance relative to the structure of FIG. 1 as compared with the greater reduction of series resistance provided by the embodiment of FIG. 2A.

METHODS OF FABRICATION

First Embodiment—LOCOS Collar

FIGS. 3A–3F show the process flow in the manufacturing of a deep trench capacitor 300 in accordance with the first embodiment of this invention as shown in FIG. 2A. The capacitor 300 is formed in a doped semiconductor substrate 315, e.g. a semiconductor chip.

Figure 3A:
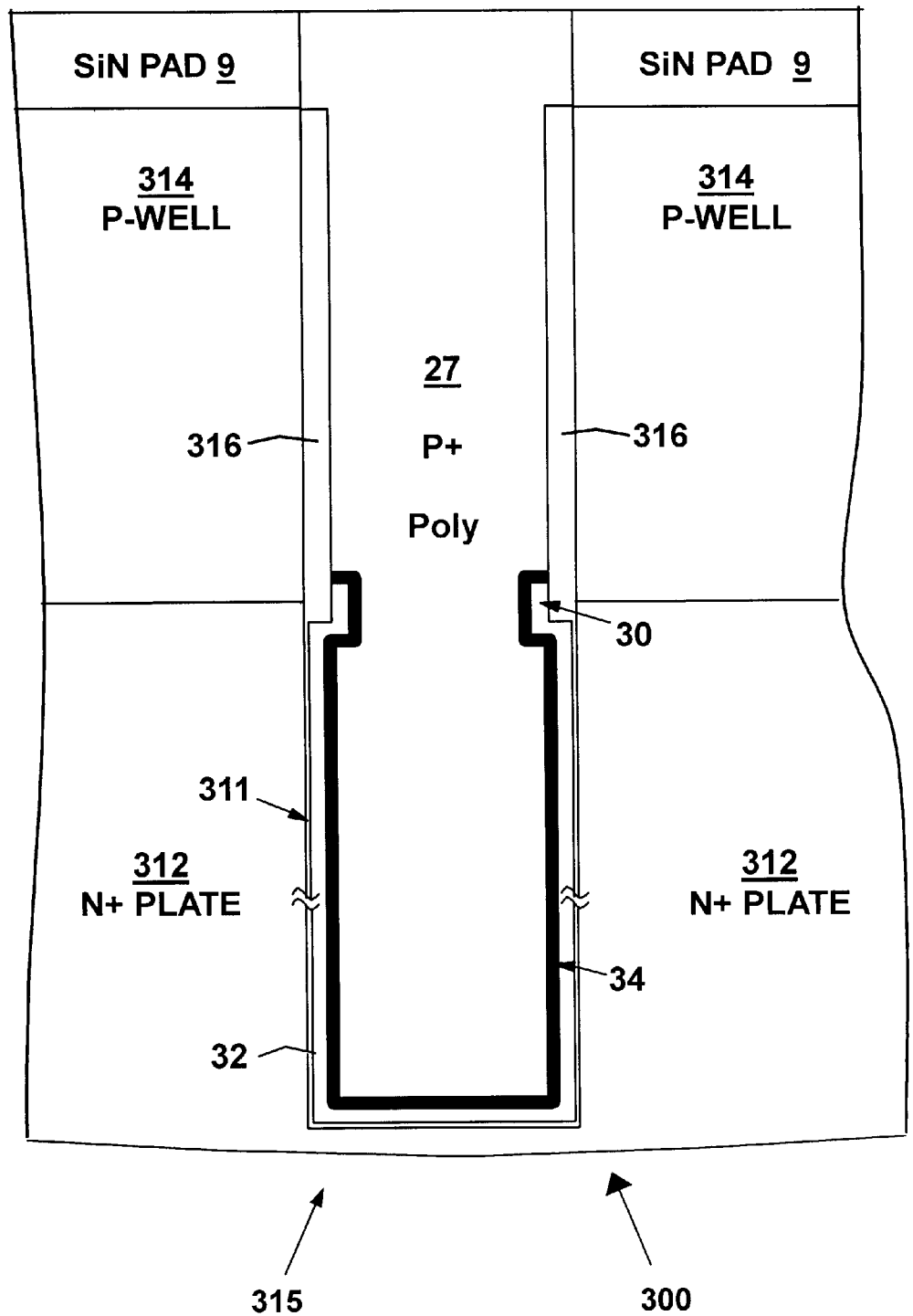
FIGS. 3A–3F illustrate the process of manufacture of a DT capacitor in accordance with a first embodiment of this invention for a DT capacitor in a doped semiconductor chip.

Referring to FIG. 3A, the capacitor 300 is formed in a deep trench 343 that has been formed partially in a P-well 314 and extending into the substrate 315. Deep trench processing is performed, in the customarily practiced manner, through early stages up to the step of forming the node dielectric layer 311. The early stages include deep trench etching through an opening in a silicon nitride ($Si_3N_4$) pad 9 (hereinafter referred to as pad nitride 9) formed on the top surface of substrate 315. The deep trench etching process is performed for the purpose of forming the deep trench 343 by masking of the lower portion of the deep trench 343 with a recessed nitride mask layer (not shown) while oxidizing the upper portion of the deep trench 343 to form a LOCOS collar 316.

The recessed nitride mask layer is then removed and an outdiffusion for forming the N+ outer electrode. 312 is performed by using Arsenic-doped Silicon Glass (ASG) deposition followed by a drive-in step. Alternatively a Gas Phase Doping (GPD), or a similar technique is used.

The walls of the upper portion of the deep trench 343 are masked above the outer electrode 312 by the presence of the high collar 316, as seen in FIG. 3A, which as shown in FIG. 3A reaches to the top of the deep trench 343. Below the high collar 316, a node dielectric layer 111 is then formed (typically comprising silicon nitride/silicon oxide $Si_3N_4$/$SiO_2$). Then a thin (<10 nm) buffer layer 32 of a thin film of N+ doped polysilicon is deposited over the node dielectric layer 111. Note that the thin film, buffer layer 32 is doped with N+ doping as is the N+ outer electrode 312, which now surrounds the lower portion of the deep trench 343.

As will be well understood by those skilled in the art, a photoresist (resist) recess process is then used to remove the upper portion of N+ polysilicon layer 32 from the upper portion of the deep trench 343. Note that it is important here to note that the N+ polysilicon buffer layer 32 overlaps the bottom of the collar 316, at buffer layer overlap region 30, to prevent damage to the node dielectric 311 from subsequent processing.

Then the highly conductive, lower diffusion barrier layer 34 (i.e. TiN, WN) described above is deposited as a thin film, and recessed in a manner similar to the processing of the previous N+ polysilicon buffer layer 32. The resulting structure, which is the starting point for further processing, is shown in FIG. 3A with the lower diffusion barrier layer 34 covering the N+ polysilicon buffer layer 32, and the lower diffusion barrier layer 34 reaches just above the top of the buffer layer 32 reaching into contact with the lower portion of the isolation collar 316.

FIG. 3A illustrates the results of the early steps of the first embodiment of the process which is illustrated by capacitor 300 formed in a semiconductor substrate or chip 315 which is processed as shown in FIGS. 3A–3F in which a LOCOS isolation collar 316 is formed followed by customary deep trench processing through formation of the node dielectric 311. The buffer layer 32, composed of N+ doped polysilicon fill and the conductive diffusion barrier layer 34 are formed as described in the text above. Then deep trench 343 is overfilled with P+ doped polysilicon fill to be used as the bulk inner electrode 27 (storage node) which has been planarized to the top surface of the pad nitride 9.

Figure 3B:
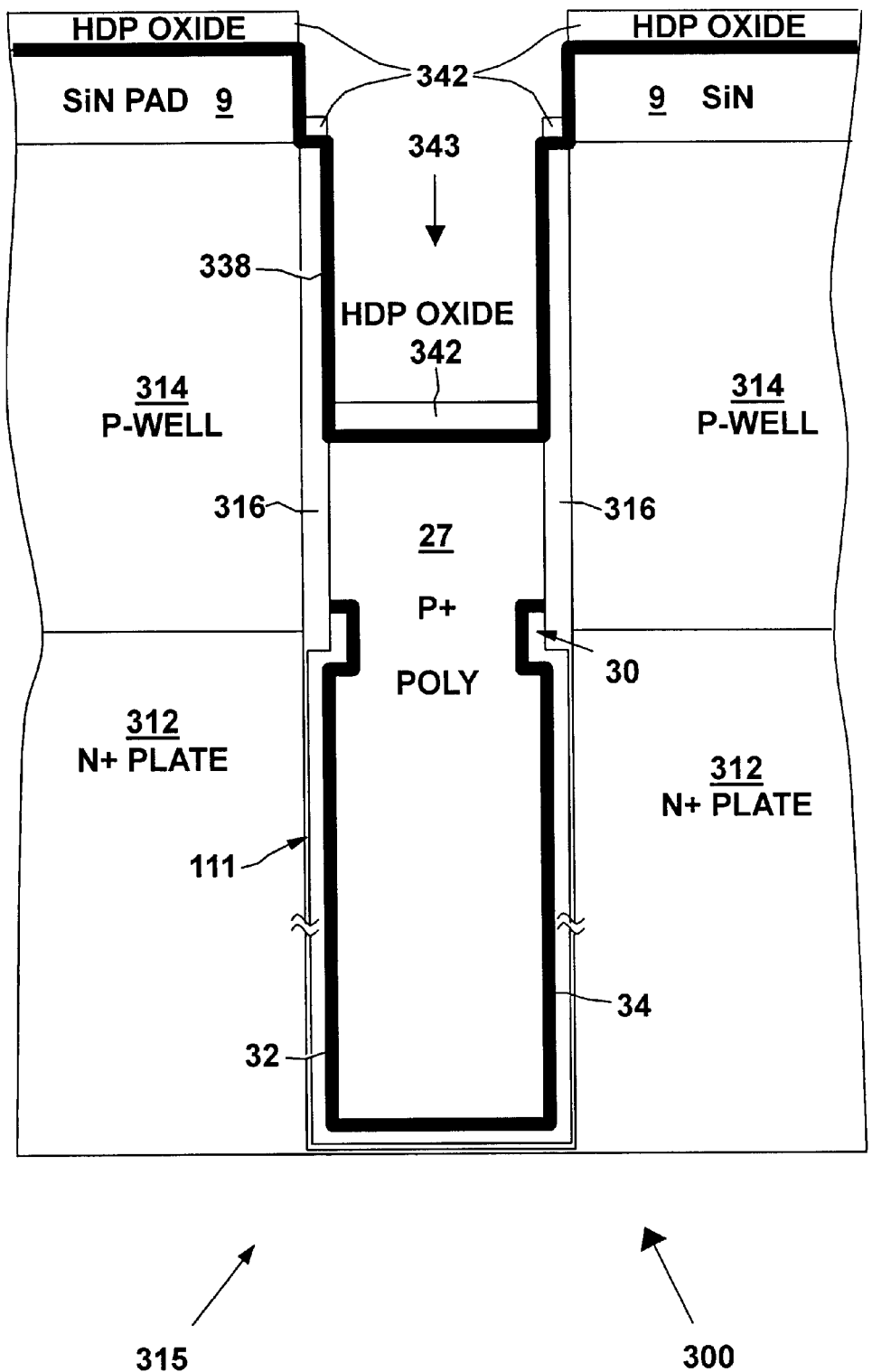

FIG. 3B shows the product of FIG. 3A after further processing starting with recessing the P+ polysilicon, bulk inner electrode 27 substantially to a depth which is slightly below the depth where the buried strap 319 is to be formed subsequently by outdiffusion from the N+ polysilicon cap 340 seen in FIG. 3F.

Next, a blanket thin film, upper, conductive diffusion barrier 338 (i.e. TiN, WN) was deposited covering the top surface of the bulk inner electrode 27, the sidewalls of the isolation collar 316, as well as the sidewalls and the top surface of the silicon nitride pad 9.

Then an HDP (High Density Plasma) oxide layer 342 was deposited to a substantial thickness on horizontal surfaces of the capacitor 300 in a substantially anisotropic, HDP deposition from TEOS (TetraEthylOrthoSilicate). Any small amount of the HDP oxide layer 342, which forms on the sidewalls of the trench 343 is removed with a short isotropic etch, leaving the horizontal surfaces covered by the HDP oxide layer 342 so that the remaining HDP oxide 342 is located on top of the upper, conductive diffusion barrier layer 338 above the bulk inner electrode 27, above the isolation collar 316 and above the silicon nitride pads 9. This exposes the surfaces of the upper, conductive diffusion barrier layer 338 adjacent to the sidewalls of the silicon nitride pad 9 and the isolation collar 316.

Figure 3C:
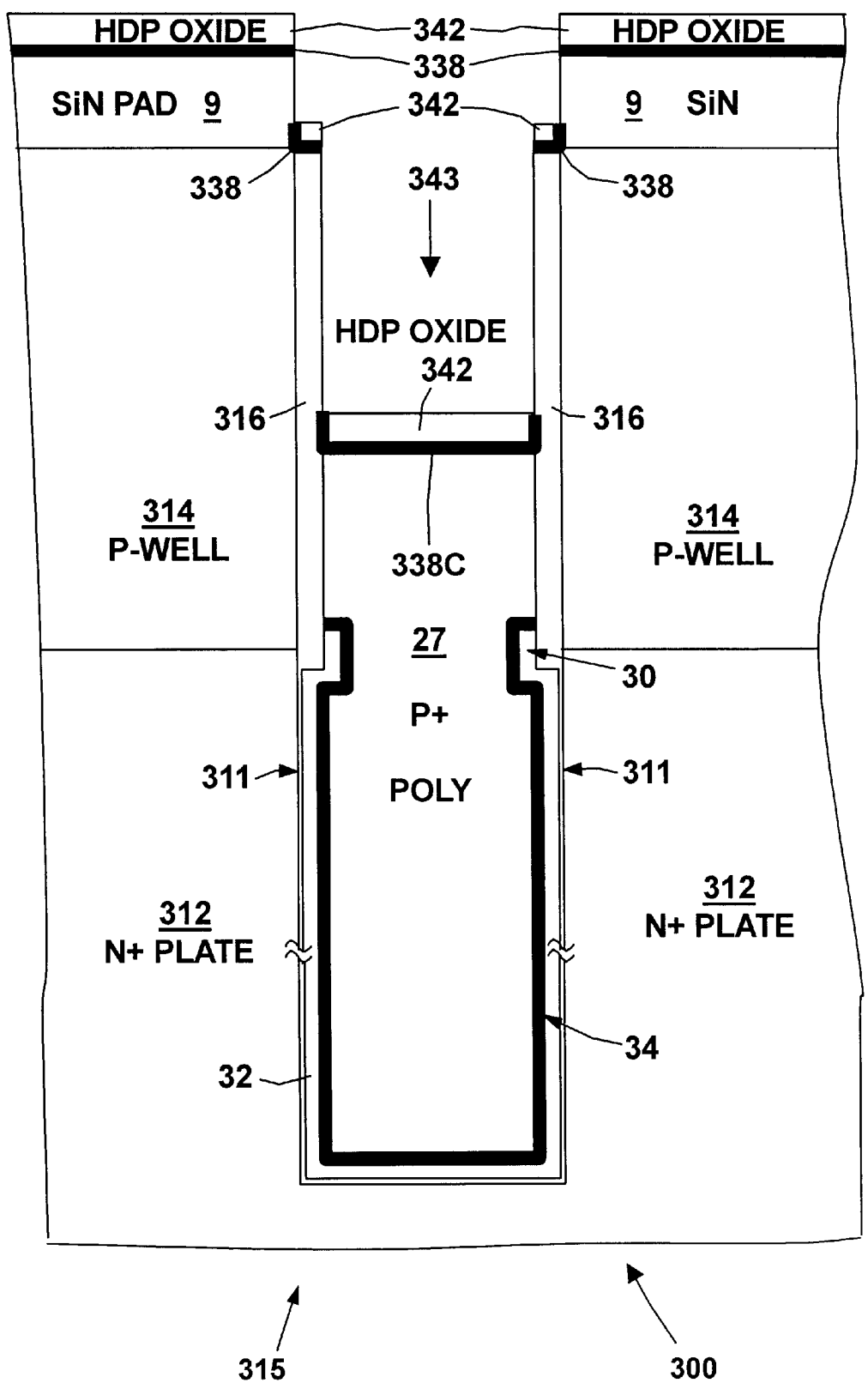

FIG. 3C shows the product of FIG. 3B after the exposed portions of the diffusion barrier 338 (unprotected by the HDP oxide layer 342) have been removed by etching selectively with an isotropic etch which removes the upper, conductive diffusion barrier 338 (i.e. TiN, WN) without attacking the silicon oxide of the HDP oxide layer 342 and the silicon nitride of the pad layer 9 leaving a cup-shaped portion of the upper, conductive diffusion barrier 338 at the bottom of the unfilled portion of the trench 343. The preferred etchant employed to remove TiN, WN is a peroxide based clean.

Figure 3D:
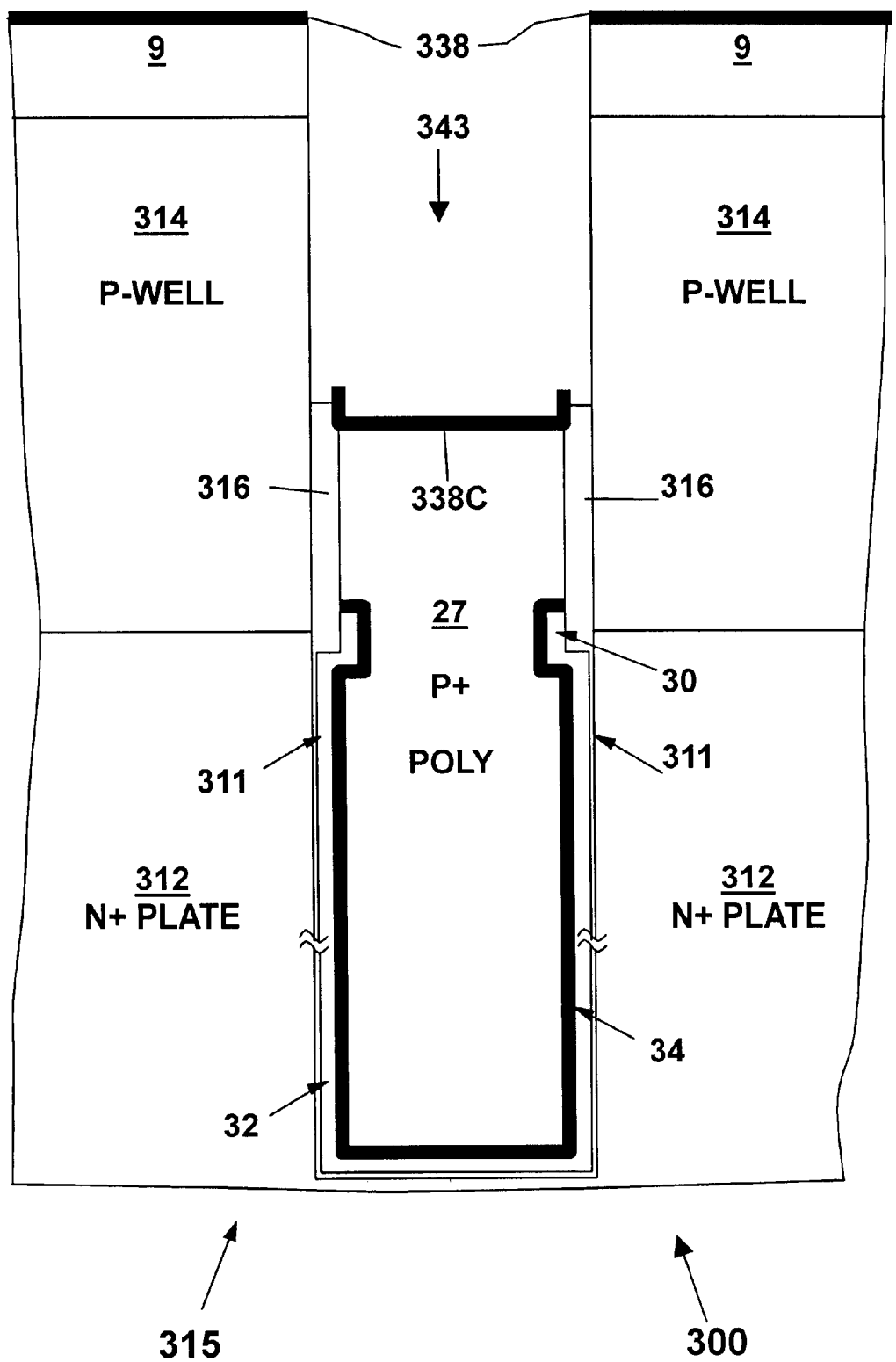

FIG. 3D shows the product of FIG. 3C after selectively etching exposed areas of silicon oxide layers 342/316 (without attacking the diffusion barrier 338) thereby removing all of the remaining HDP oxide layer 342, as well as, removing the uppermost, exposed portions of the collar oxide 316 above the upper, conductive diffusion barrier 338, i.e. surfaces unprotected by the cup-shaped portion. Removal of the upper portions of the isolation collar 316 exposes upper sidewalls of the P-well 314, clearing away the upper portion of the surface of the P-well 314 that permits the formation of the outdiffusion region comprising buried strap 319 seen in FIG. 3F. The removal of the HDP oxide layer 342 exposes all of the remaining surfaces of the upper, conductive diffusion barrier 338 including the cup-shaped portion 338C above the bulk inner electrode 27 and the upper, conductive diffusion barrier 338 above the silicon nitride pads 9. The preferred etchant employed to remove the HDP oxide is a fluorine based wet etch (i.e. buffered HF).

Figure 3E:
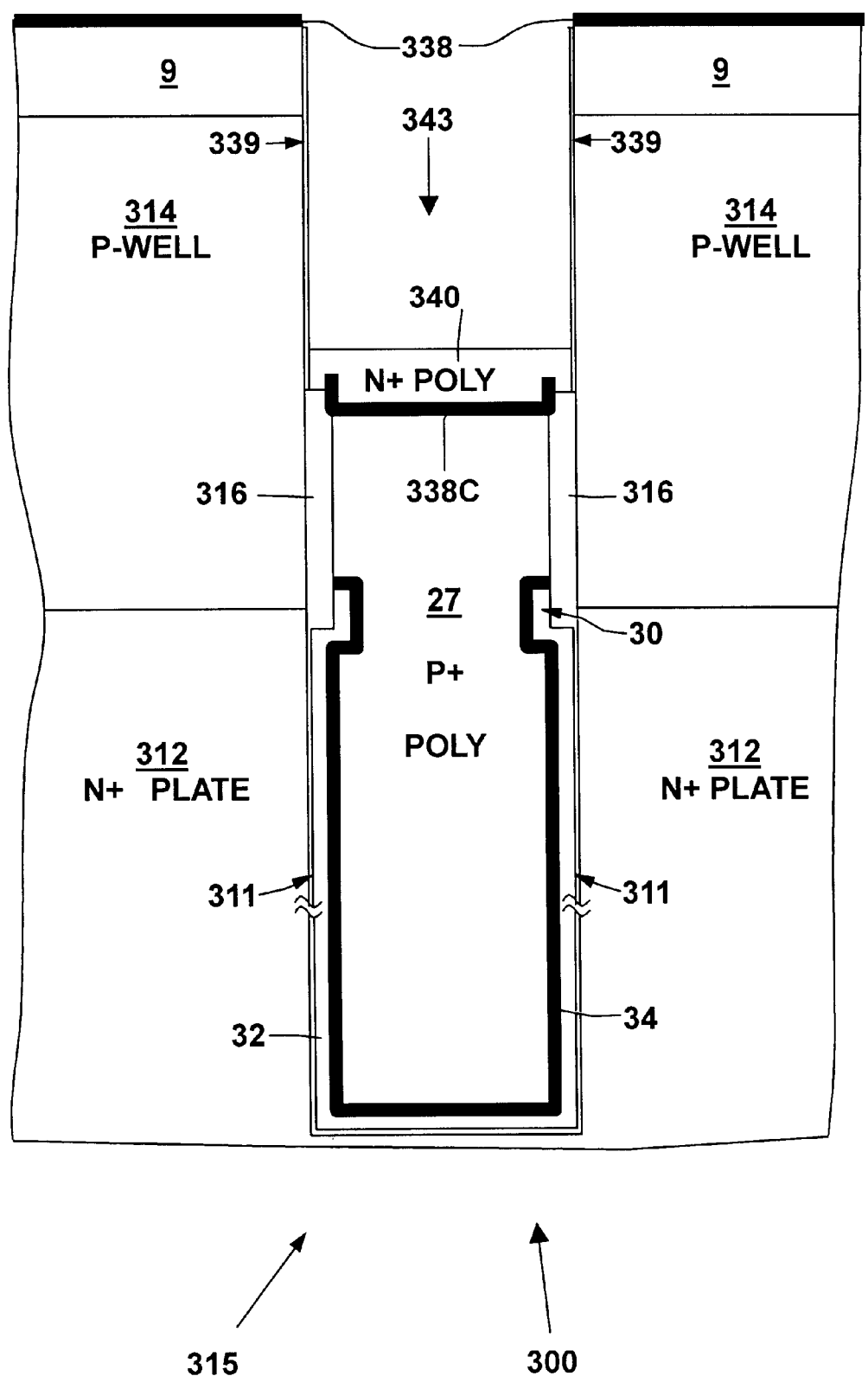

FIG. 3E shows the product of FIG. 3D after a very thin silicon nitride layer 339 (0.7 nm thick silicon nitride) was formed over the exposed silicon surface of upper portion of P-well 314, to serve as a subsequent etch stop, which step is then followed by the step of forming a conductive cap 340 above the cup-shaped portion 338C of upper, conductive diffusion barrier 338. The silicon nitride layer 339 may be selectively formed on the exposed silicon surface by reaction of the silicon with a nitrogen containing ambient.

The conductive cap 340 is formed by filling the upper portion of the deep trench 343 with N+ polysilicon, that is later planarized and recessed to form the cap 340 which covers cup-shaped portion 338C of the upper, conductive diffusion barrier 338 above the bulk inner electrode 27, leaving a portion of the N+ polysilicon cap 340 in contact with the very thin nitride etch stop layer 339 juxtaposed with the sidewall of the P-well 314 to form the outdiffusion region comprising buried strap 319 (FIG. 3F) by outdiffusion of N+ dopant from the cap 340 through the thin (0.7 nm thick) nitride etch stop layer 339 into the P-well 314.

Subsequent hot processing breaks down the thin silicon nitride etch stop layer 39 in regions between the N+ doped polysilicon cap 340 and the outdiffusion region comprising the buried strap 319, thereby desirably reducing series resistance.

Figure 3F:
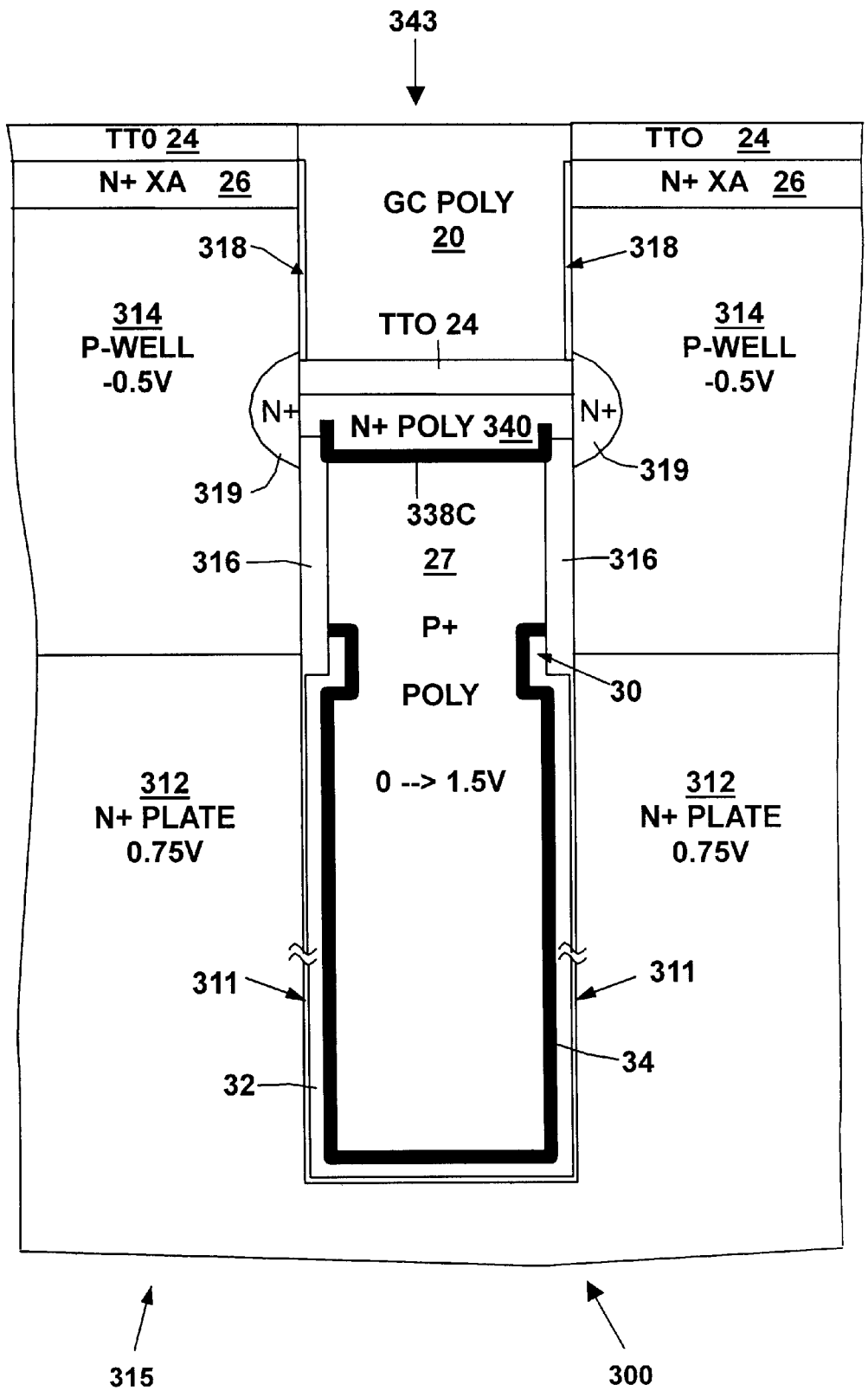

FIG. 3F shows the product of FIG. 3E after the exposed portion of the remainder of the upper, conductive diffusion barrier 338 and pad nitride layer 9 have been stripped. The portion of upper, conductive diffusion barrier 338 below the cap 340 is protected and remains in place. A variety of processes (e.g. resist recess, CMP, selective etch) may be used to accomplish the above tasks. XA and well implants are then done to form the N+ bitline diffusion 26 and to establish the channel doping in the vertical array MOSFET. Then, a TTO (Trench Top Oxide) layer 24 is formed using HDP oxide. Several steps follow including forming an array gate sacrificial oxide, performing a sacrificial oxide strip, and formation of the gate oxide layer 318 by oxidation on the surface of the P-well 314 are then performed.

The exposed portion of the very thin silicon nitride layer 339 is removed by isotropic etching with hydrofluoric ethylene glycol (HFEG) following recessing of the N+ doped polysilicon cap 340.

Then a doped gate polysilicon layer 20 is deposited and planarized to the top of the TTO layer 24. Customary processing then follows to completion of the capacitor 300 and the remainder of the chip 315.

Second Embodiment—Polysilicon Buffered LOCOS or Deposited Collar

Figure 4A:
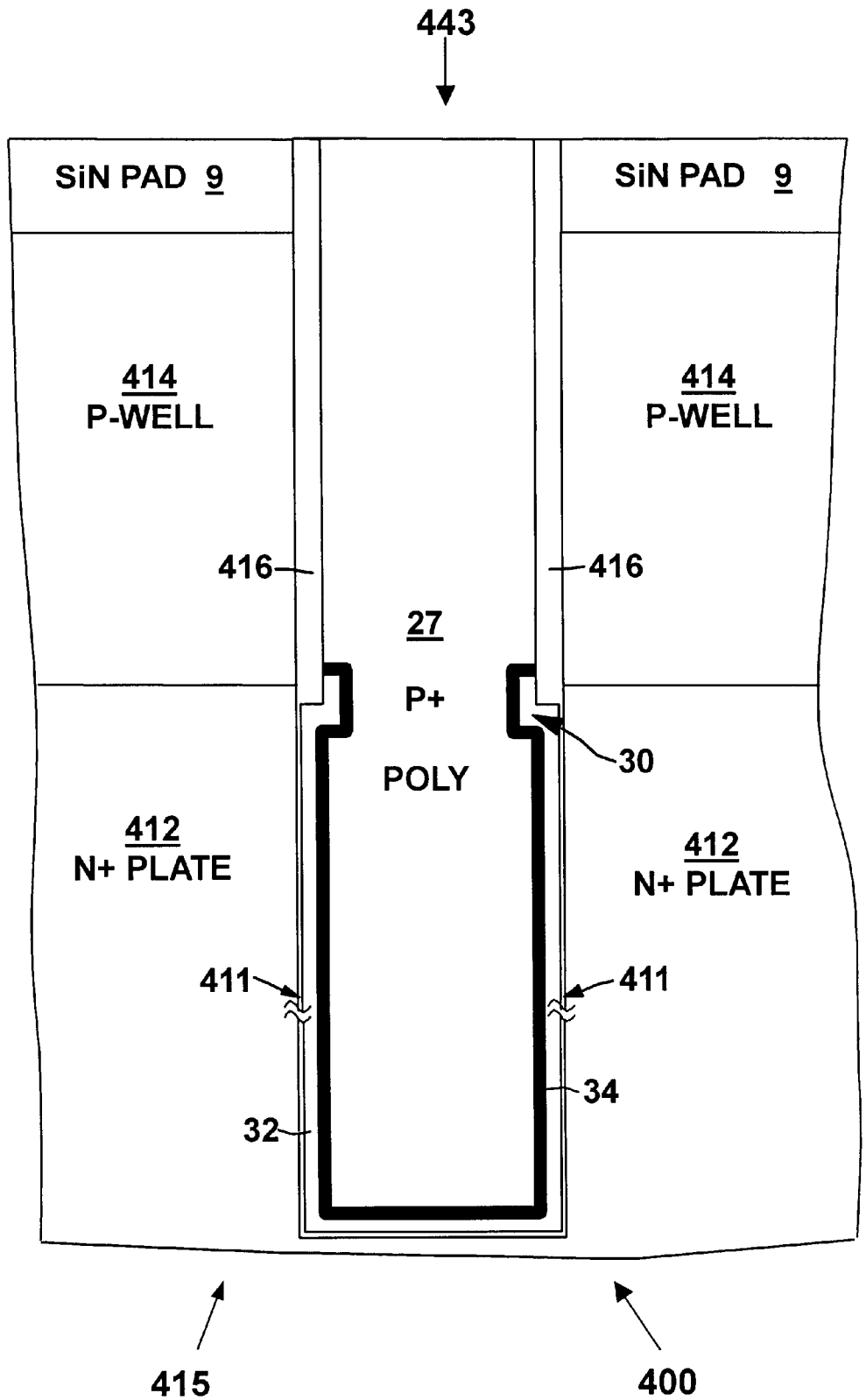
FIGS. 4A–4C illustrate the process of development of a second embodiment of a DT capacitor in a doped semiconductor chip in accordance with invention.
Figure 4B:
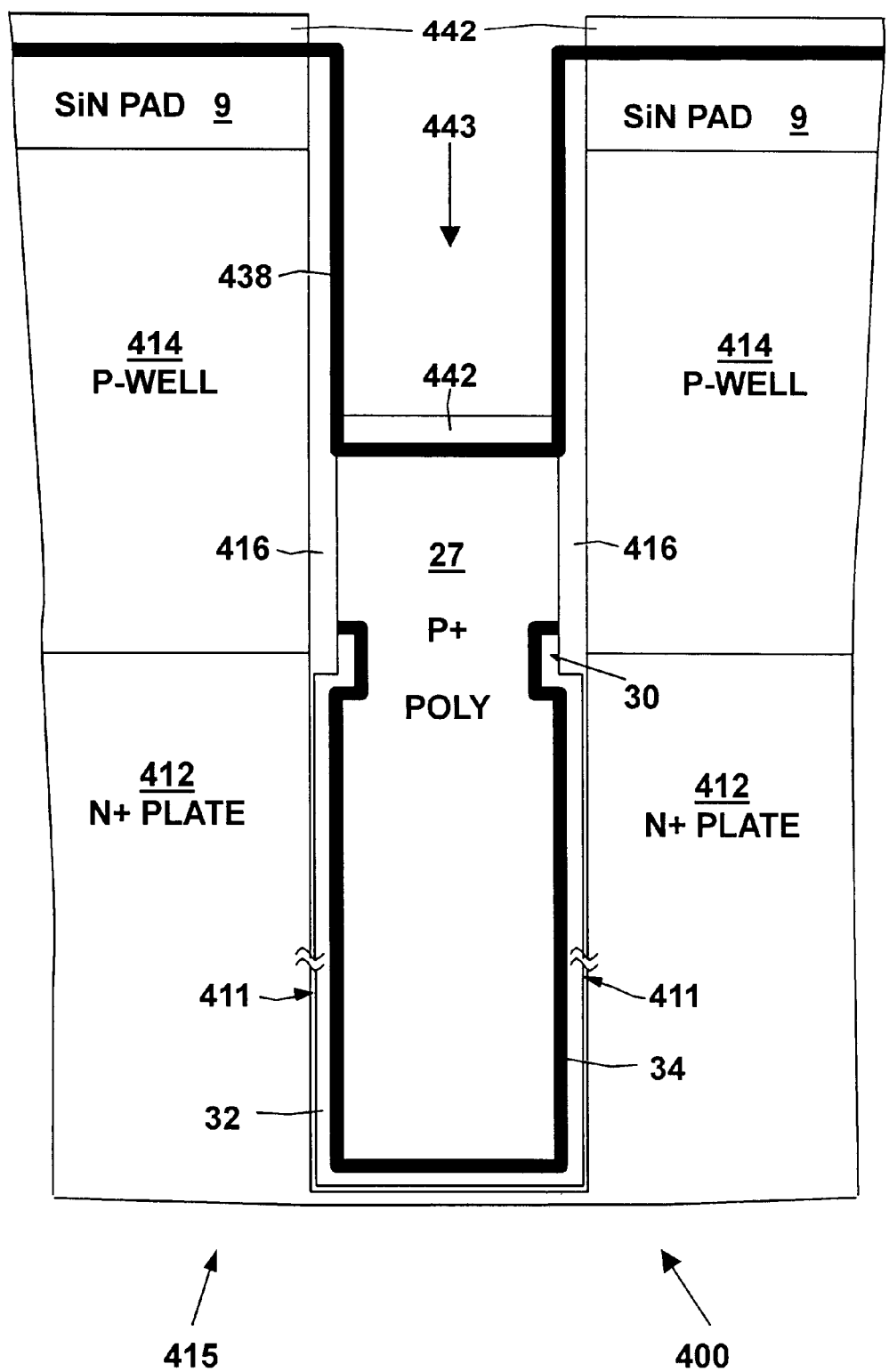
Figure 4C:
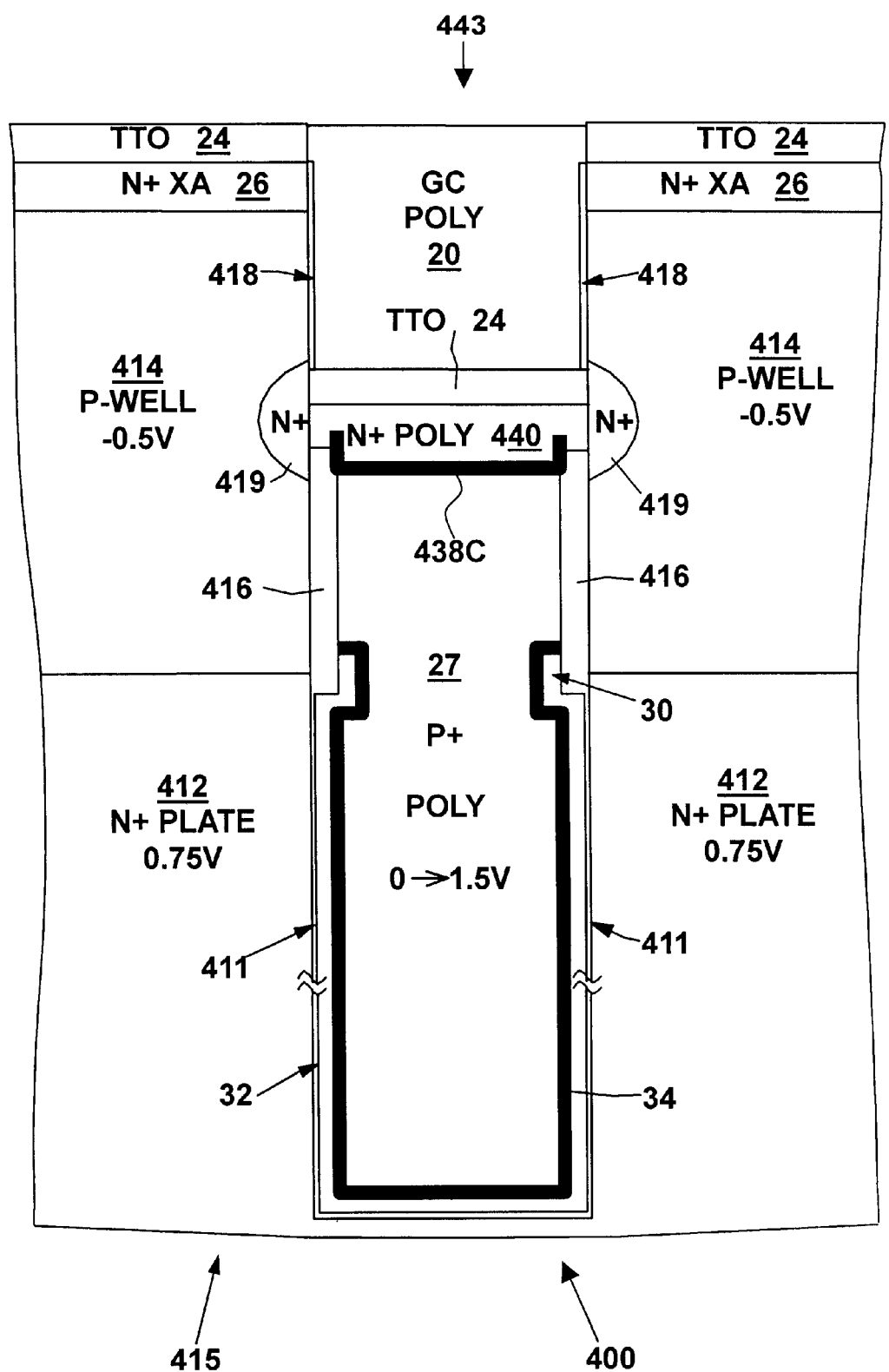

FIGS. 4A–4C illustrate the development of a capacitor 400 which is a second embodiment in accordance with invention, which differs from the first embodiment of FIGS.

3A–3F in that instead of the LOCOS collar 316 of FIGS. 3A–3F, a polysilicon buffered LOCOS (PBL) or deposited collar 416 is formed in the substrate 415, e.g. a semiconductor chip.

As shown in FIG. 4A, the collar 416 now extends from near the bottom of the P-Well 414 to the top surface of the pad nitride 9. All other processing steps up to this point are identical to what is described for first embodiment including formation of the N+ doped plate electrode 412 lower in the substrate 415, formation of the N+ polysilicon buffer layer over the node dielectric 411 which is formed on the inner walls of the N+ plate electrode 412 and reaches over the lower end of the isolation collar at buffer layer overlap region 30.

The next step was formation of the lower, conductive diffusion barrier 34 over the N+ polysilicon buffer layer 34 which reaches up to the lower portion of the isolation collar 416 covering the upper portion of the N+ polysilicon buffer layer 32. Following deep trench processing which includes formation of a polysilicon buffered LOCOS or deposited collar 416, all other steps are the same as shown for first embodiment in FIGS. 3A–3F.

FIG. 4B shows the product of FIG. 4A after the P+ polysilicon bulk inner electrode 27 which reached to the top of the trench 443 in FIG. 4A has been etched to a recessed depth which is slightly below the depth of where the buried strap region 419 (shown in FIG. 4C) is to be formed subsequently, by outdiffusion, as explained above. Then, an upper, conductive diffusion barrier 438 (i.e. TiN, WN) was deposited, followed by an anisotropic deposition of an HDP oxide layer 442. The HDP oxide layer 442 forms substantially only on the horizontal surfaces. Any small amount of HDP oxide layer 442 which forms on the sidewalls is removed from the sidewalls of upper barrier layer 438 with a short isotropic etch, leaving the horizontal surfaces covered by the HDP oxide layer 442, as explained above.

FIG. 4C shows the product of FIG. 4B after completion of a series of processing steps in accordance with this invention which are identical to series of steps described in connection with FIGS. 3C–3F. The upper, conductive diffusion barrier 438 and the pad nitride layer 9 have both been stripped from substrate 415, except that the cup-shaped portion 438C of the upper barrier layer 438 remains where it was protected by the HDP oxide layer 442.

In the next step, the HDP oxide layer 442 was removed followed by forming the N+ doped polysilicon cap 440 followed by formation of the N+ doped strap 419 by diffusion of N+ dopant into the P-well 414 near the periphery of the cap 440.

Then the TTO layer 24 is formed using HDP oxide followed by forming the gate oxide 418. Thus, the cup-shaped portion 438C of upper, conductive diffusion barrier 438 below the cap 440 is protected and remains in place.

A variety of processes (e.g. resist recess, CMP, selective etch) may be used to accomplish the above tasks. XA and well implants are then made to form the N+ bitline diffusion 26 and to establish the channel doping in the vertical array MOSFET. Several steps follow including forming an array gate sacrificial oxide, performing a sacrificial oxide strip, and formation of the gate oxide layer 418 by oxidation of the surface of the P-well 414 are then performed.

Then a doped gate polysilicon layer 20 is deposited and planarized to the top of the TTO layer 24. Customary processing then follows to completion of the capacitor 400 and the remainder of the chip 415.

Third Embodiment—LOCOS Collar with Protective Silicon Nitride Spacers

Figure 5A:
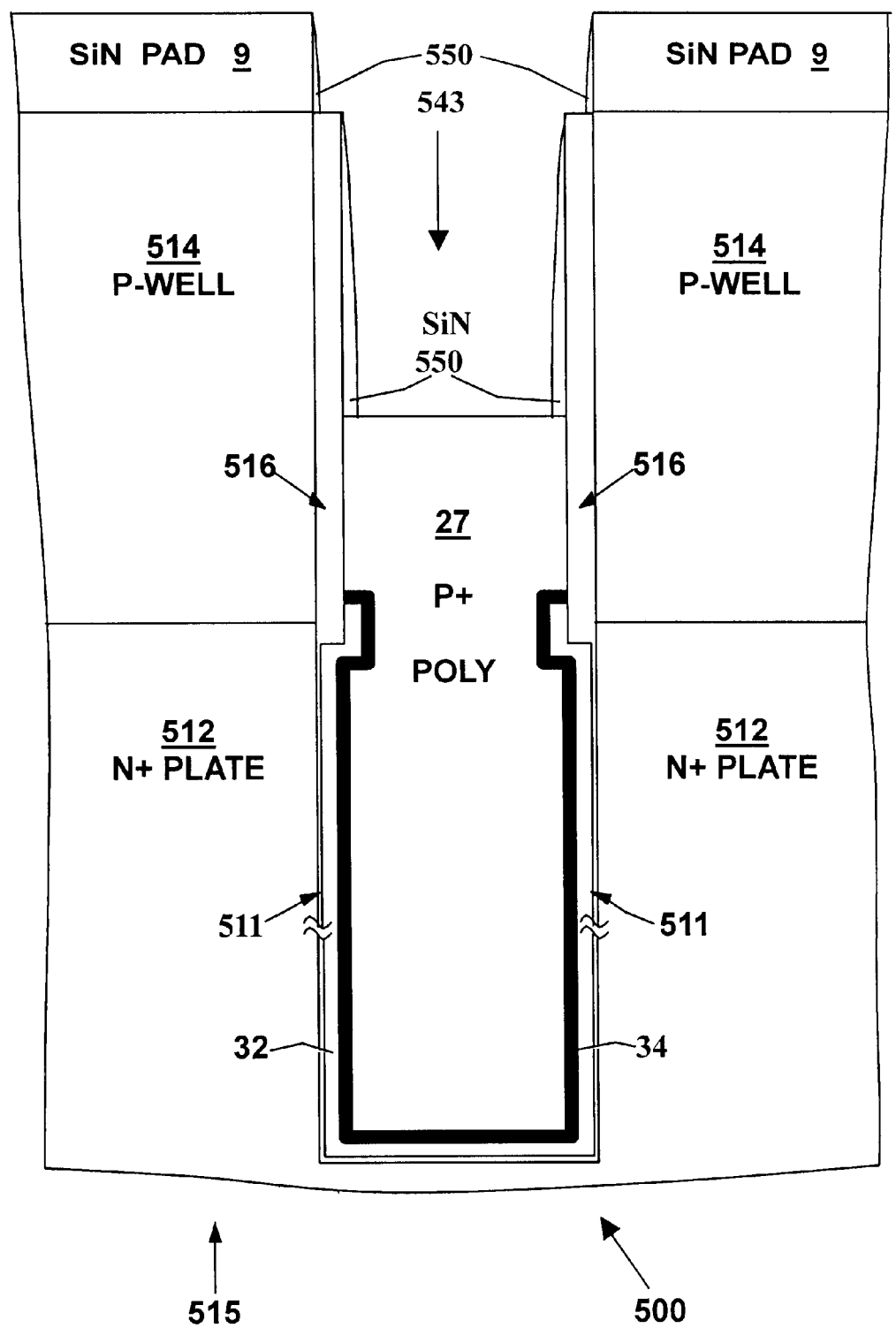
FIGS. 5A–5F illustrate the development of a third embodiment of this invention, which comprises a capacitor formed in a semiconductor chip by a modification of the method of FIGS. 3A–3F.
Figure 5B:
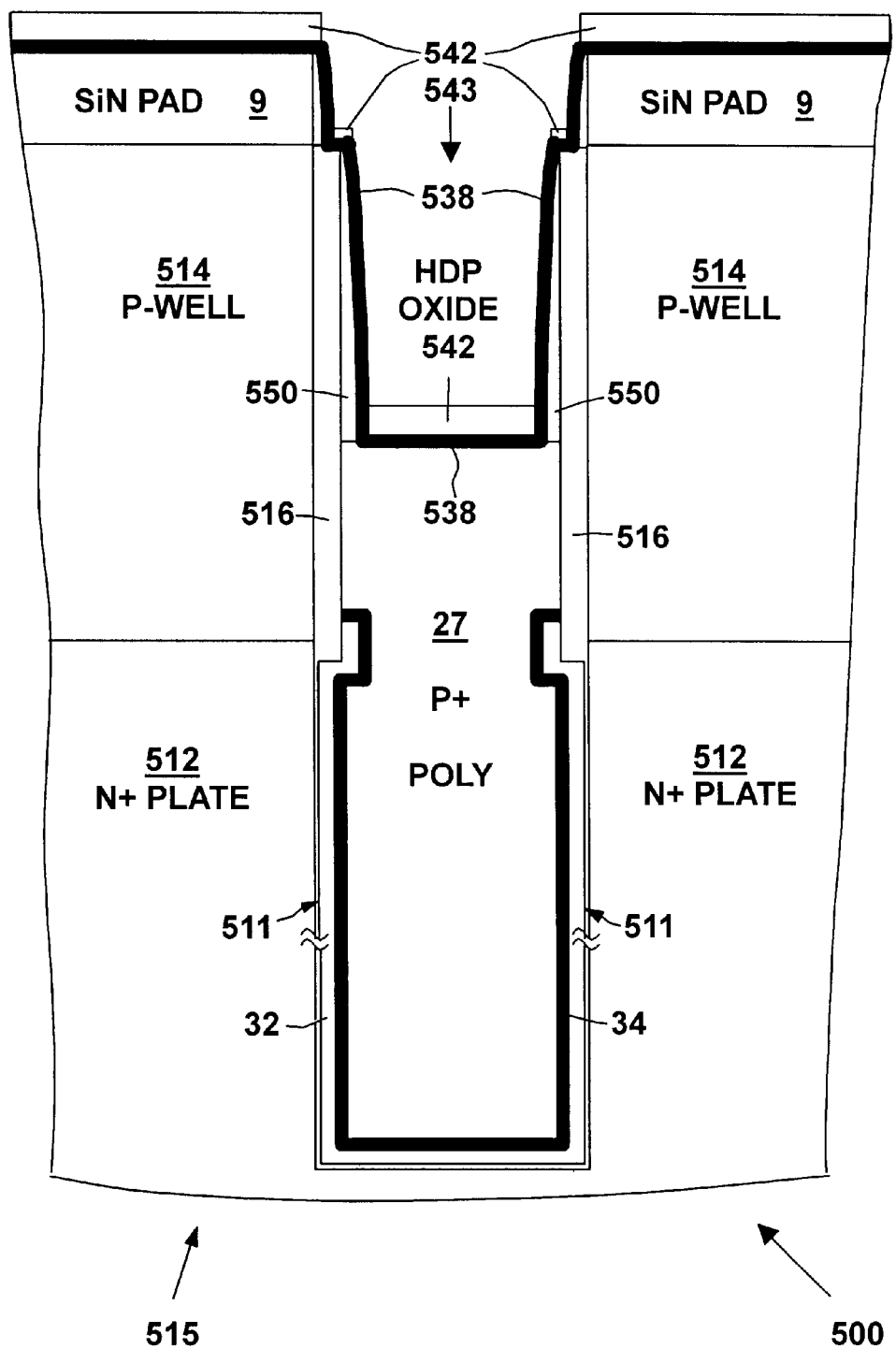
Figure 5C:
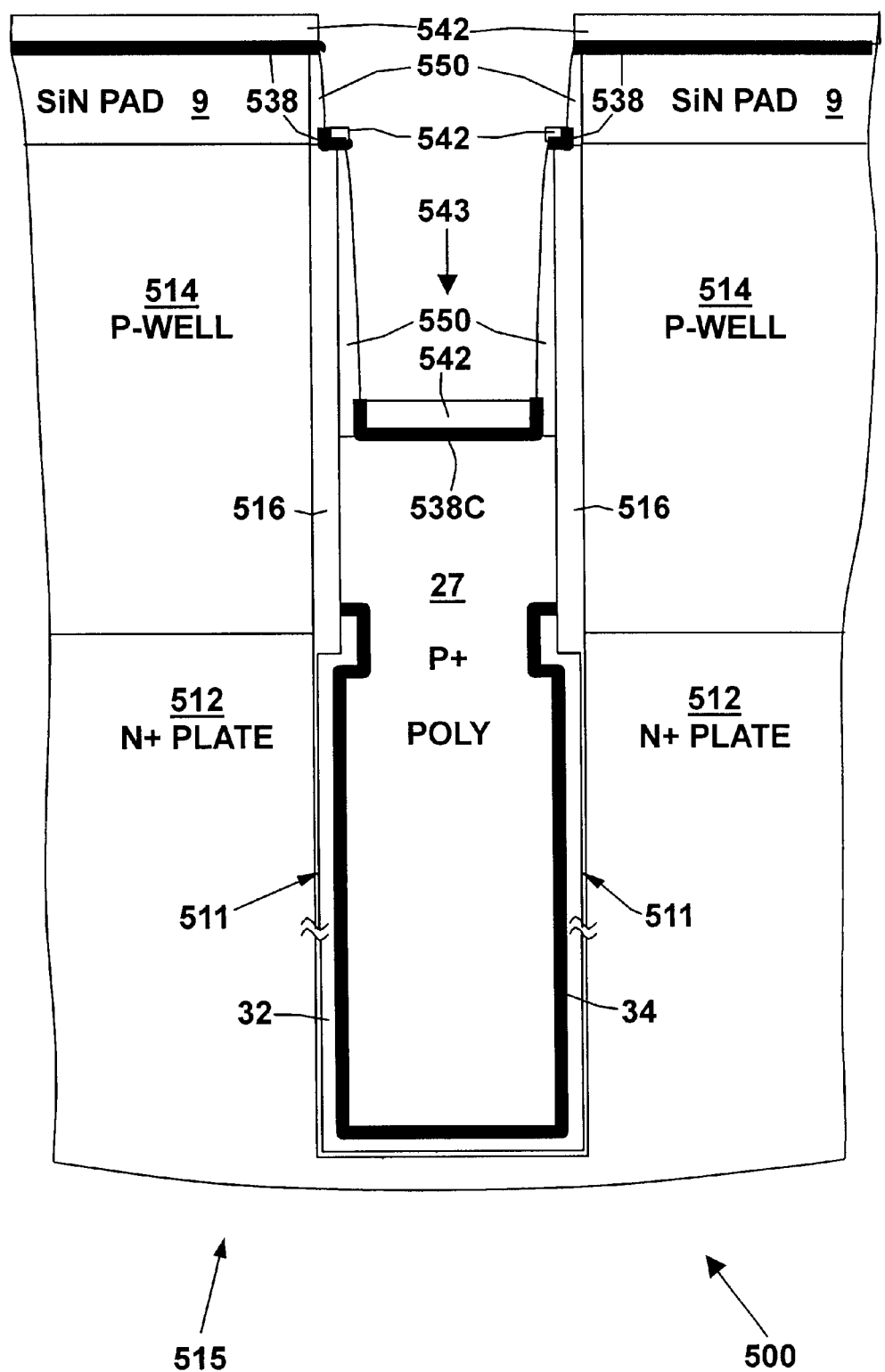

FIGS. 5A–5C illustrates the process steps of a third process for the manufacture of an embodiment of this invention which comprises a capacitor 500 formed in a deep trench 543 in substrate 515, e.g. a semiconductor chip. Capacitor 500 differs from the first embodiment of FIGS. 3A–3F, in that protective nitride sidewall spacers 550 are formed over a LOCOS isolation collar 516. The sidewall spacers 550 serve to protect the isolation collar 516 during the removal of the upper, conductive barrier layer 538 (as shown in FIGS. 5B and 5C) from the sidewalls of the P-well 514 in the upper portion of the deep trench 553. Processing is identical to the process described above through what is shown in FIG. 3A of first embodiment.

After the P+ polysilicon bulk inner electrode 27 is recessed, a silicon nitride layer is deposited and etched by RIE process to form silicon nitride spacers 550 on the vertical surface of collar 516 above bulk inner electrode 27 and on the vertical surface of the silicon nitride ($Si_3N_4$) pad 9 above the isolation collar 516 in FIG. 5A.

FIG. 5B shows the product of FIG. 5A after deposition of an upper, conductive diffusion barrier layer 538 (TiN, WN) over the silicon nitride pad 9 and covering the surfaces within the deep trench 553 including the silicon nitride sidewall spacers 550 and the top surface of the bulk inner electrode 27. Then, HDP oxide layer 542 is deposited in an anisotropic process. A short isotropic oxide etch may be used to remove the small amount of HDP oxide layer 542 from the sidewalls of the upper, conductive diffusion barrier layer 538.

FIG. 5C shows the product of FIG. 5B after the portion of the upper conductive diffusion barrier layer 538 which was not protected in FIG. 5B by the HDP oxide layer 542 was selectively etched away from the upper conductive diffusion barrier 538 without removing the HDP silicon oxide layer 542 and the silicon nitride sidewall spacers 550, leaving the cup-shaped portion 538C and other horizontally extending portions of the upper conductive diffusion barrier layer 538 below three horizontally extending portions of the HDP silicon oxide layer 542.

Figure 5D:
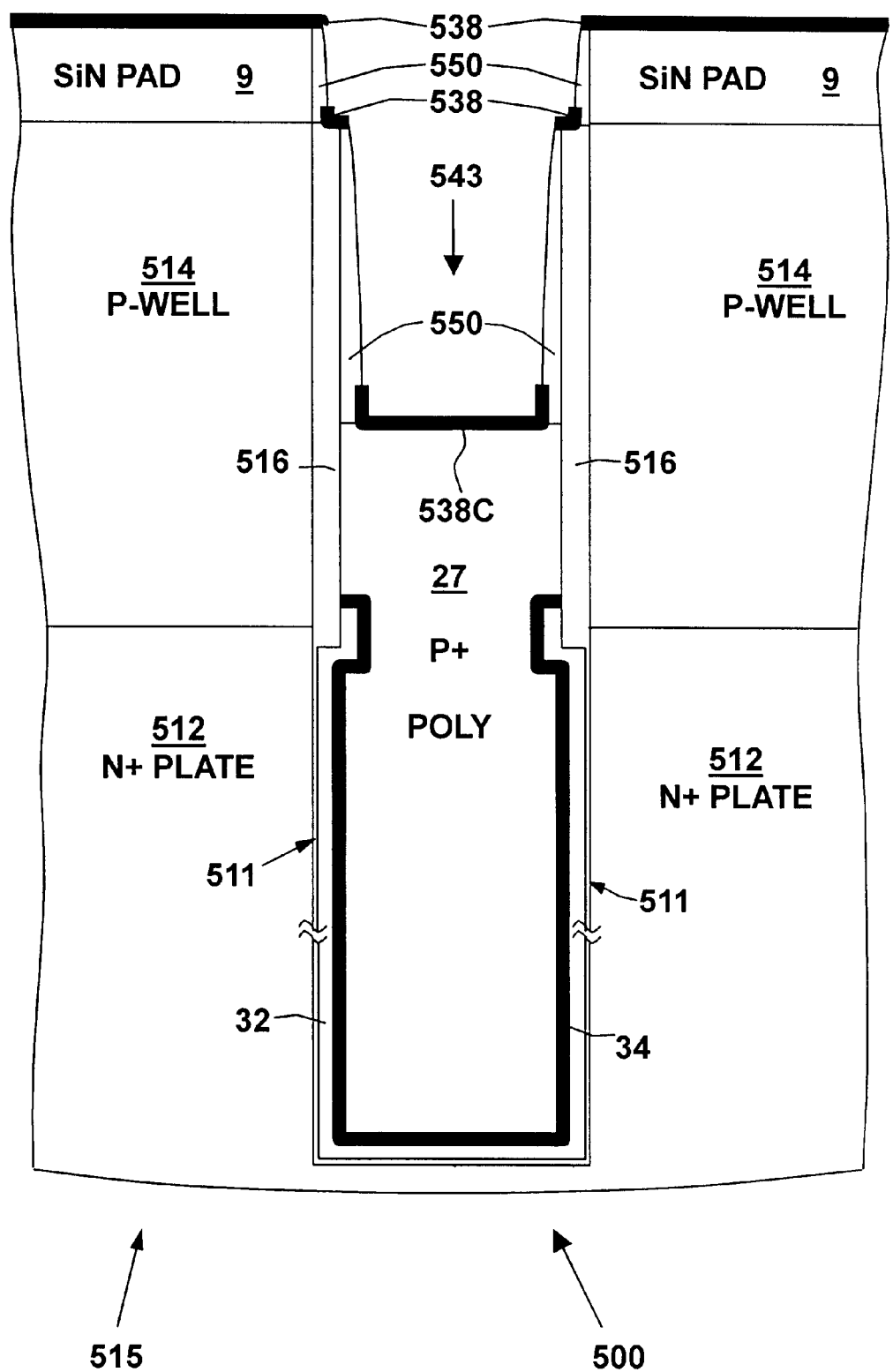

FIG. 5D shows the product of FIG. 5C after the HDP oxide layer 542 was selectively stripped without removing the silicon nitride sidewall spacers 550 and the upper, diffusion barrier layer 538. The HDP oxide layer 542 was stripped from the surfaces of the remaining portions of the upper diffusion barrier layer 538, exposing the top surface of the cup-shaped portion 538C.

Figure 5E:
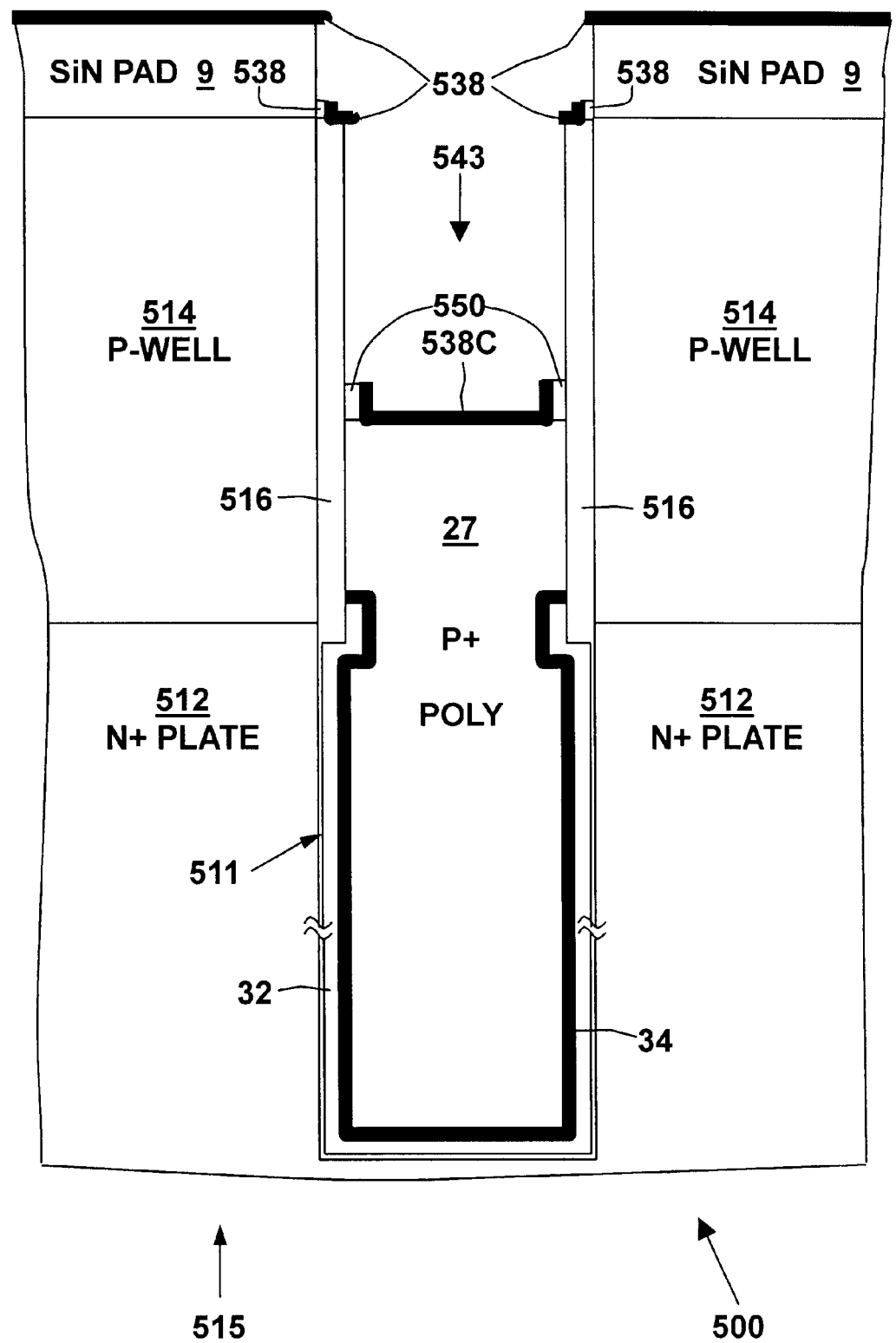

In FIG. 5E, the protective silicon nitride ($Si_3N_4$) spacers 550 are stripped selectively to retain the silicon oxide collar 516 and the upper, conductive, diffusion barrier 538. There may be some pullback of the pad nitride 9 during this operation, but it should not have any detrimental consequences. A portion of the spacers 550 remains extending alongside the sides of the cup-shaped portion 538C of the upper, conductive, diffusion barrier 538.

Figure 5F:
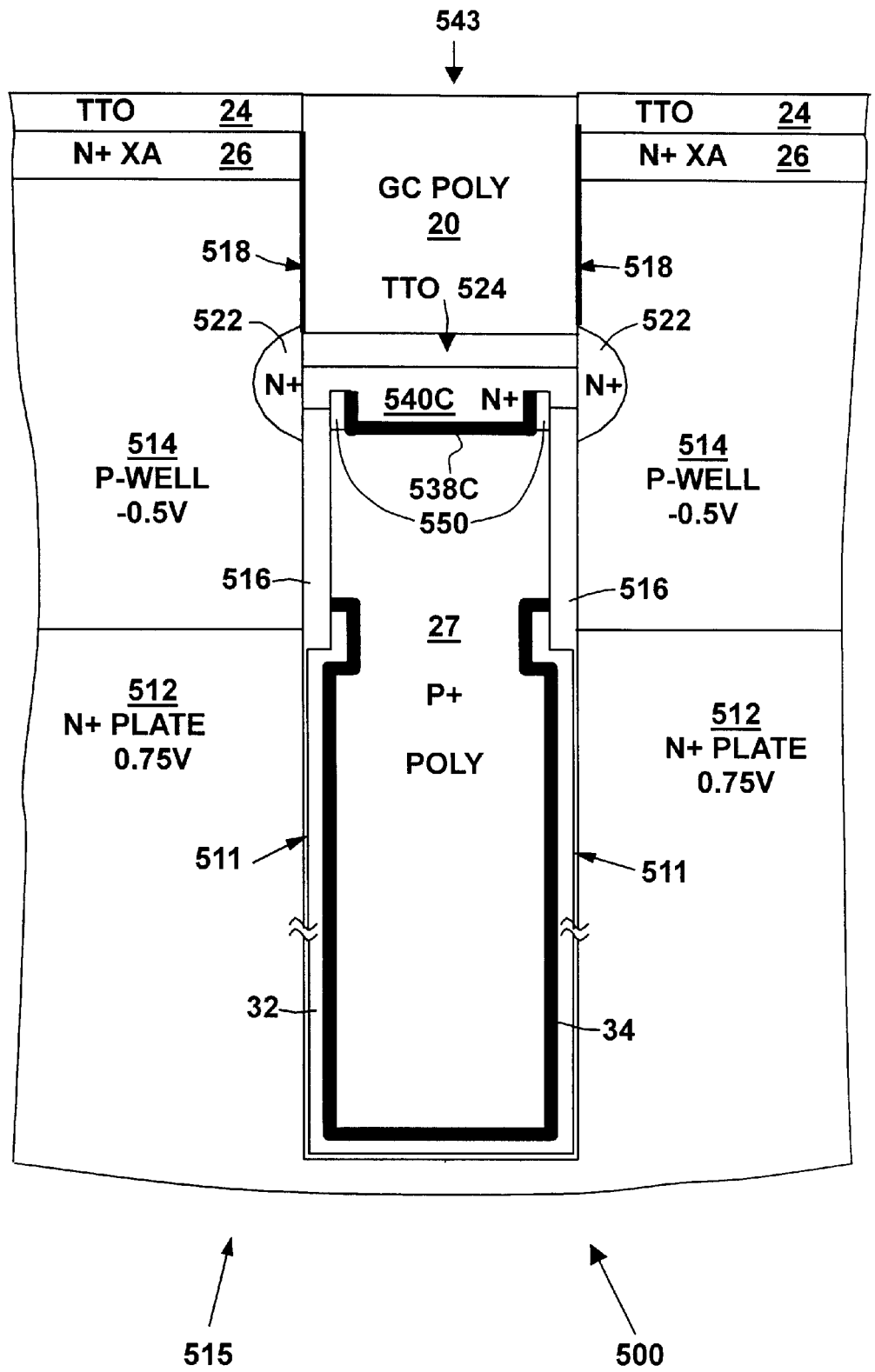

In FIG. 5F, following the formation of the upper N+ polysilicon layer 540, as described in the first embodiment (FIGS. 3A–3F) covering the cup-shaped portion 538C of the upper, conductive, diffusion barrier 538, the top layer of upper barrier material 538 and pad nitride 9 are then stripped leaving only the cup-shaped portion 538C of material 538 on top of capacitor node 27. As in the previous embodiments, the upper N+ polysilicon layer 540C is recessed back well below the top of the trench 543, as described above. A variety of processes (e.g. resist recess, CMP, selective etch) may be used to accomplish this task.

XA and well implants are then done to form the N+ bitline diffusion 26 and to establish the channel doping in the vertical array MOSFET. A TTO (deep trench top oxide)

layer 24 is then formed using HDP oxide. Array gate sacrificial oxide, sacrificial oxide stripping, and formation of gate oxide 518 are then done. Then gate electrode 20 of polysilicon is deposited over the TTO layer 24. Then gate electrode 20 is planarized. Customary processing follows to complete the capacitor 500.

Fourth Embodiment

Figure 6A:
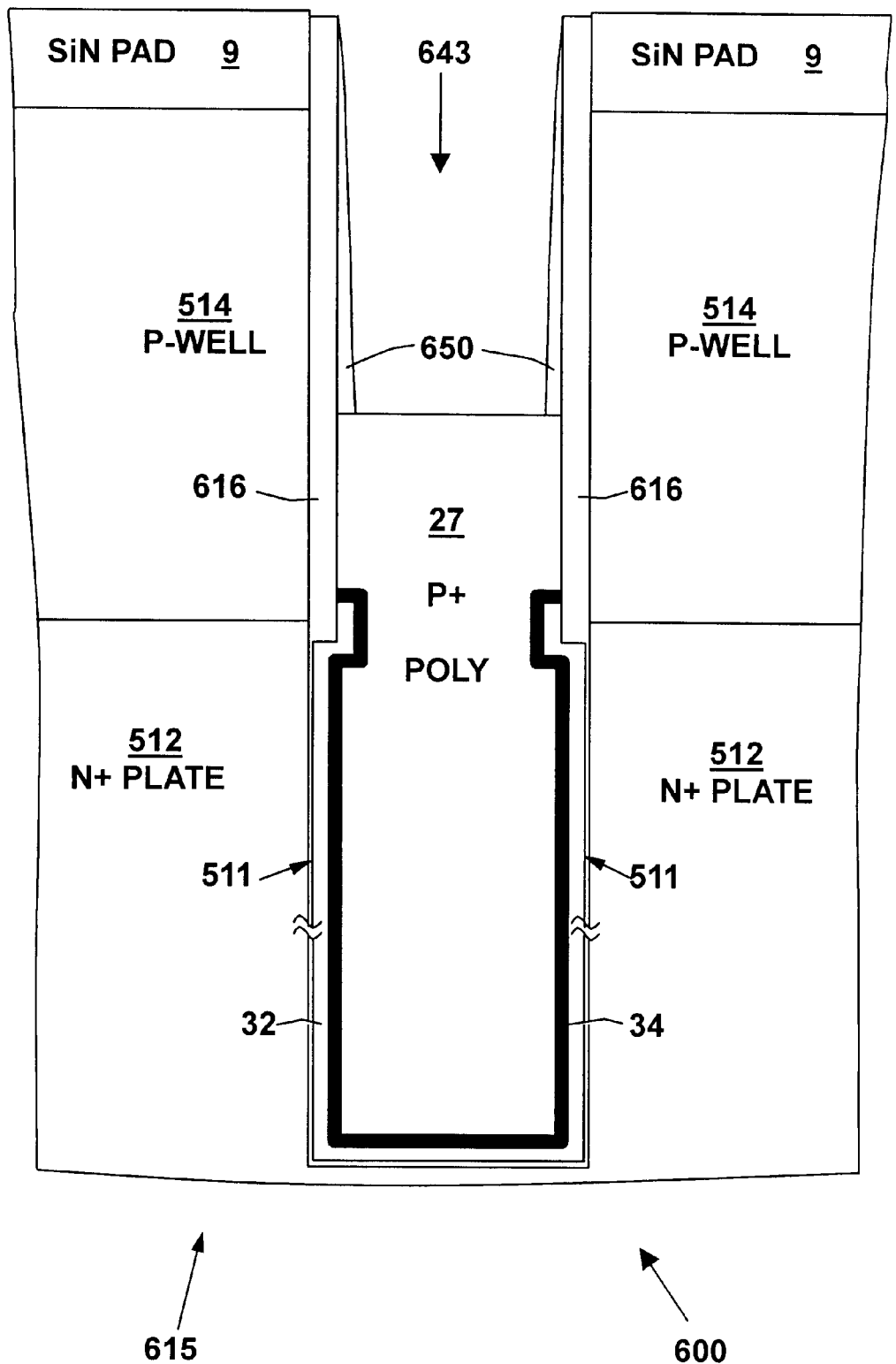
FIGS. 6A–6B illustrate a modification of the process of FIGS. 5A–5F with an isolation collar and spacers that reach above the trench top to the pad layer top.
Figure 6B:
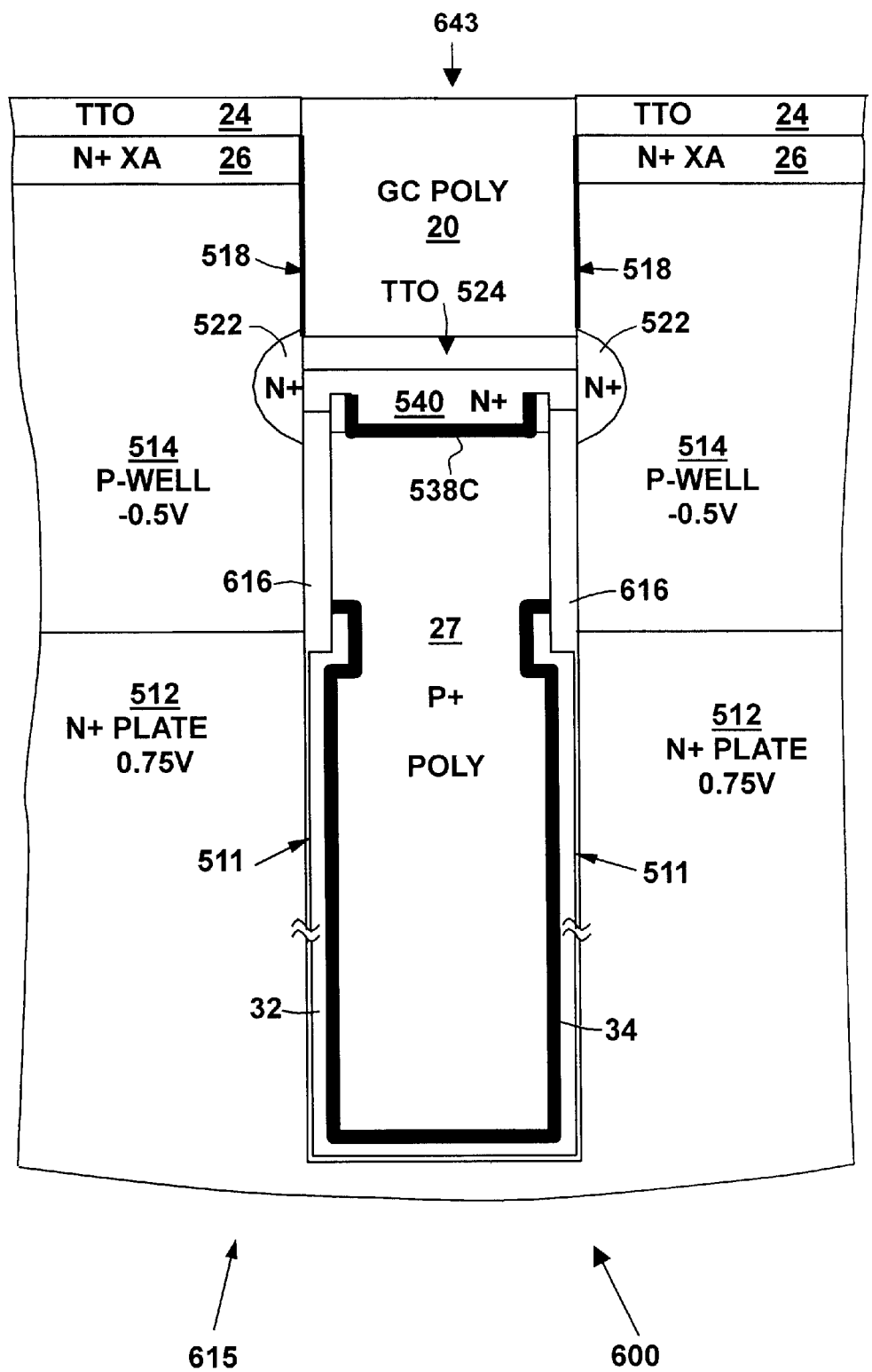

The fourth embodiment of the method of this invention comprises a capacitor 600 formed in trench 643 in a semiconductor chip 615, that is illustrated by FIGS. 6A and 6B, which show modifications of the third embodiment shown by FIGS. 5A–5F, wherein like reference numbers refer to like parts. The difference from the third embodiment of this invention is that the polysilicon buffered LOCOS or deposited isolation collar 616 reaches to the top of the silicon nitride pad 9.

In turn, the isolation collar is covered with protective silicon nitride spacers 650 which also reach up to the top level, i.e. the top of the pad 9. Otherwise the process is substantially the same as FIGS. 5B–5F. In the fourth embodiment, a polysilicon buffered LOCOS or deposited isolation collar layer 616 is formed, followed by the formation of protective nitride spacers.

FIG. 6A is a schematic diagram which illustrates the fourth embodiment of this invention following the formation of the protective silicon nitride spacers 650 on the sidewalls of the Poly Buffered LOCOS (PBL) or LOCOS isolation collar 616 in the trench 643. The spacers 650 serve to protect the isolation collar 616 during the removal of the upper, conductive barrier layer 538 as shown by reference to FIG. 6B from the sidewalls of the P-well 514 in the upper portion of the deep trench 653.

Processing is identical through what is shown in FIG. 3A of first embodiment.

After the P+ polysilicon bulk inner electrode 27 is recessed, a layer of silicon nitride is deposited and etched in a RIE process to form silicon nitride spacers 650 on the vertical surface of the collar 616 above the bulk inner electrode 27 and the silicon nitride pad 9, as seen in FIG. 6A.

FIG. 6B shows the fourth embodiment with a resulting structure which is shown to be substantially the same as the structure shown in FIG. 5F since only the intermediate process steps are different.

Fifth Embodiment

Figure 7A:
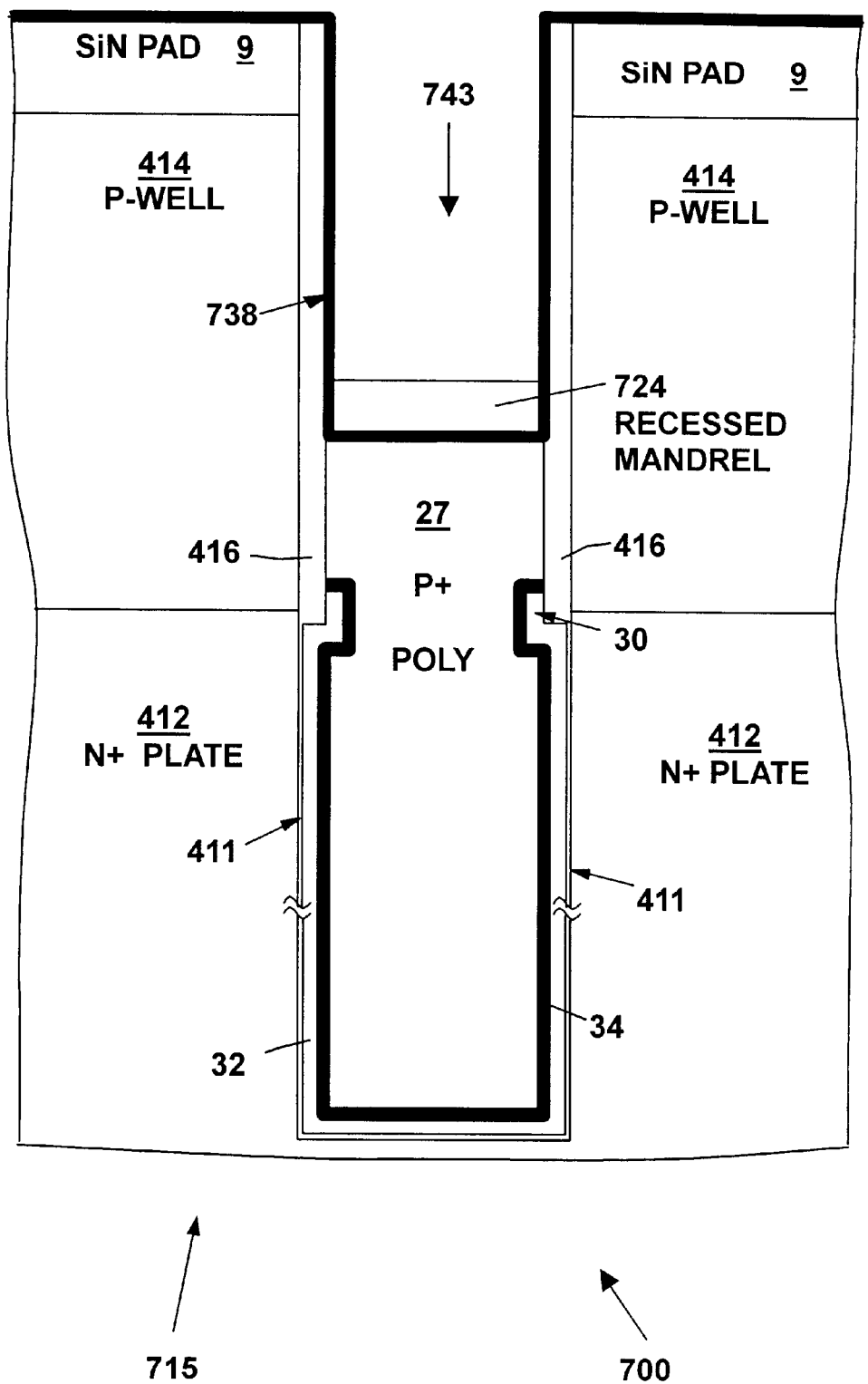
FIGS. 7A–7B illustrates use of a mandrel as a mask for shaping the upper, conductive diffusion layer in a modification of the process of FIGS. 4A–4C which employs a blanket HDP oxide layer to pattern the upper, conductive diffusion layer.
Figure 7B:
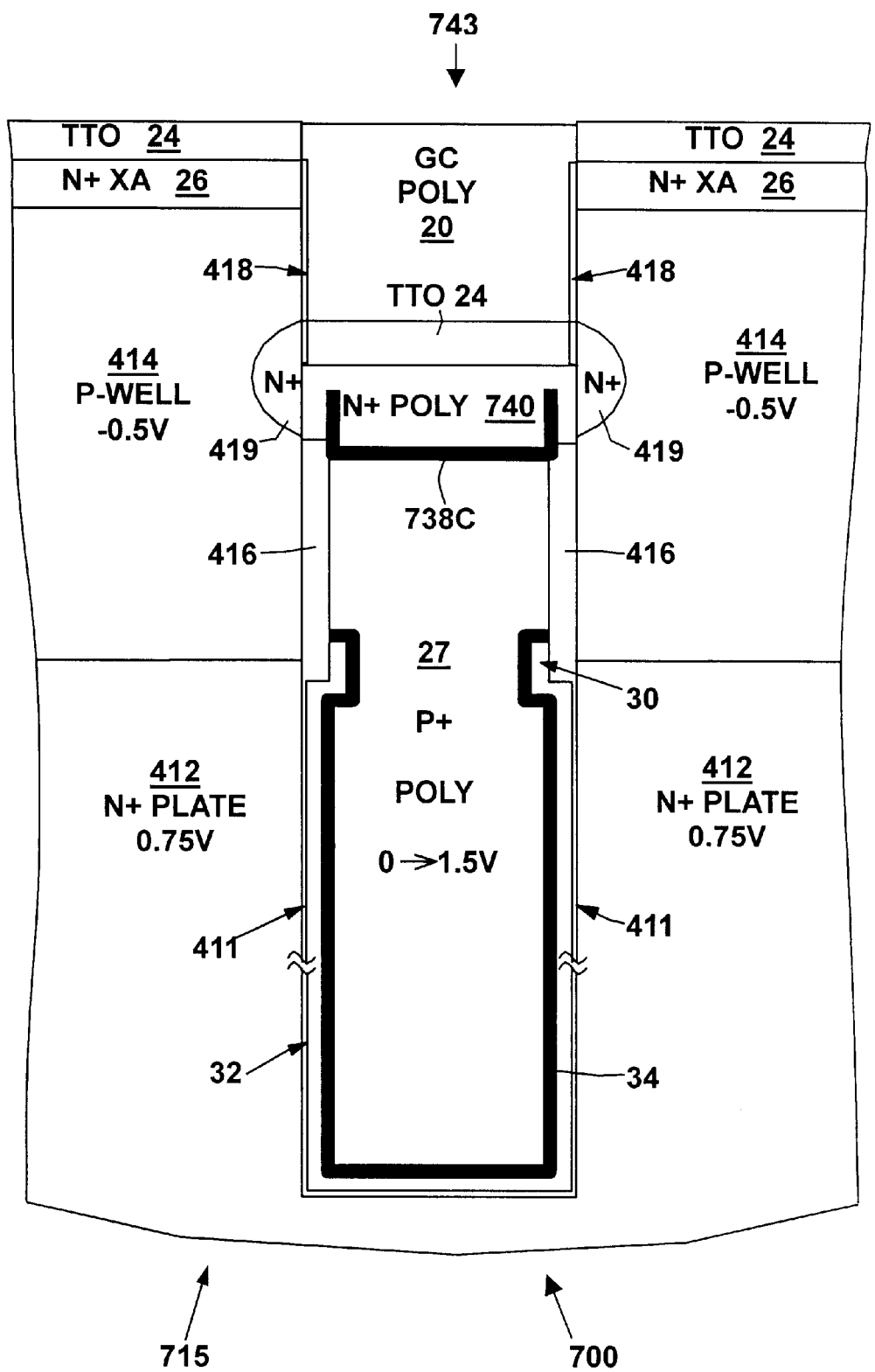

FIGS. 7A and 7B show a fifth embodiment that differs from the second embodiment of FIGS. 4A–4C in that a recessed mandrel 724 is used to mask the upper diffusion barrier 738, instead of the HDP oxide layer 442 shown in FIG. 4B.

The embodiment of FIGS. 7A and 7B includes modifications of the second embodiment shown by FIGS. 4A–4C, wherein like reference numbers refer to like parts. The recessed mandrel 724 is formed by filling the aperture in the upper portion of the deep trench 743 with a masking material (e.g. resist, silicon oxide) and recessing that material to a predetermined depth as shown in FIG. 7A.

Following the deposition of the upper conductive diffusion barrier 738, the aperture of deep trench 743 is filled with a masking material (e.g. resist, oxide). The masking material is then recessed to a predetermined depth. Processing which is identical to that of the second embodiment of FIGS. 4A–4C follows.

The interactions of the solutions to the problems addressed by this invention (namely, allowing reduced collar thickness having undesirable consequences of increased node dielectric stress) have not been recognized nor addressed by others.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the new invention, what is claimed as a new and desirable to be secured by Letters Patent is as follows:

1. A method of forming a deep trench capacitor formed in an open top trench with sidewalls, and a bottom in a substrate doped with a dopant of a first polarity, comprising:

forming a counterdoped plate electrode region in the substrate surrounding the trench near the bottom by doping through sidewalls of the trench, forming a node dielectric for the capacitor on trench sidewalls, forming a counterdoped conductive buffer covering the node dielectric, forming a conductive, lower diffusion barrier layer over the buffer, forming a node conductor on the surface of the lower diffusion barrier layer, the node conductor being doped with a dopant of the first polarity, forming a conductive, upper diffusion barrier layer over the node conductor, forming a counterdoped conductive cap on the surface of the upper diffusion barrier layer doped with a dopant of the opposite polarity, and forming a counterdoped strap region by outdiffusion of dopant of the opposite polarity into a region in the substrate.

2. The method of claim 1 wherein the substrate comprises a doped silicon chip and the buffer region, the node conductor and the cap all comprise counterdoped polysilicon.

3. The method of claim 1 wherein:

the substrate comprises a doped silicon chip and the buffer region, the node conductor and the cap all comprise counterdoped polysilicon, and each of the lower and upper diffusion barrier layer are composed of a material selected from the group consisting of TiN and WN.

4. The method of claim 1 including:

the substrate comprises a doped silicon chip and the buffer region, the node conductor and the cap all comprise counterdoped polysilicon, forming each of the lower and upper diffusion barrier layers of a material selected from the group consisting of TiN and WN, forming a blanket thin film of the upper diffusion barrier covering the node conductor and the upper portion of the isolation collar, forming a silicon oxide layer on the horizontal surfaces of the upper diffusion barrier including the portion above the node conductor, and etching away the vertical surfaces of the upper diffusion layer.

5. The method of claim 4 including:

forming the silicon oxide layer by a method selected from the group consisting of the steps as follows:
a) forming HDP oxide in an anisotropic deposition of a horizontal layer, and
b) forming a recessed mandrel above the upper diffusion barrier.

6. The method of claim 1 including:

the substrate comprises a doped silicon chip and the buffer region, the node conductor and the cap all comprise counterdoped polysilicon, forming each of the lower and upper diffusion barrier layers of a material selected from the group consisting of TiN and WN, forming a blanket thin film of the upper diffusion barrier covering the node conductor, forming a silicon oxide layer on the horizontal surfaces of the upper diffusion barrier, etching away exposed surfaces of the upper diffusion layer, and forming the cap on the surface of the upper diffusion layer.

7. The method of claim 1 including:

the substrate comprises a doped silicon chip and the buffer region, the node conductor and the cap all comprise counterdoped polysilicon, forming each of the lower and the upper diffusion barrier layers of a material selected from the group consisting of TiN and WN, forming a blanket thin film of the upper diffusion barrier covering the node conductor, forming a silicon oxide layer on the horizontal surfaces of the upper diffusion barrier including the portion above the node conductor, etching away exposed surfaces of the upper diffusion layer, forming a very thin layer of silicon nitride on exposed surfaces of the sidewalls, forming the cap on the surface of the upper diffusion layer in contact with the very thin layer of silicon nitride.

8. The method of claim 1 including:

forming a pad mask over the substrate with an opening for etching the trench, forming the trench by etching through the opening, and forming an isolation collar to the top of the pad mask.

9. The method of claim 1 including:

forming a pad mask over the substrate with an opening for etching the trench, forming the trench by etching through the opening, and forming an isolation collar to the top of the substrate, forming the buffer region and the lower diffusion layer, forming the node conductor and recessing the node conductor, forming sidewall spacers alongside the isolation collar above the node conductor, forming the upper diffusion barrier as a blanket layer, masking the horizontal surfaces of the upper diffusion barrier and etching away the vertical portions of the upper diffusion barrier, stripping away the sidewall spacers, depositing and recessing the cap layer, and etching away exposed portions of the upper diffusion barrier.

10. The method of claim 1 including:

forming the capacitor in a P-welt, forming the plate by doping with N+ dopant, forming the buffer region as a thin polysilicon layer doped with N+ dopant, forming the node conductor of polysilicon doped with P type dopant, and forming the cap of N+ doped polysilicon.

11. A method of forming a deep trench capacitor formed in an open top trench with sidewalls, and a bottom in a substrate doped with a dopant of a first polarity, comprising:

forming a dielectric isolation collar on the sidewalls in a space between the top and the bottom recessed below the top and spaced away from the bottom, forming a counterdoped plate electrode region of the substrate surrounding the trench below the isolation collar by counterdoping the plate electrode region through the sidewalls and the bottom with a dopant of the opposite polarity, forming a capacitor node dielectric covering exposed sidewalls below the isolation collar, forming a counterdoped conductive buffer covering the node dielectric, forming a conductive, lower diffusion barrier layer covering the buffer, forming a node conductor on the surface of the lower diffusion barrier layer, the node conductor being doped with a dopant of the first polarity, forming a conductive, upper diffusion barrier layer over the node conductor reaching between surfaces of the isolation collar, forming a counterdoped conductive cap over the conductive, upper diffusion barrier layer, and forming a counterdoped outdiffusion strap region by diffusion of dopant of the opposite polarity into a region in the substrate juxtaposed with the periphery of the conductive cap.

12. The method of claim 11 wherein the substrate comprises a doped silicon chip and the buffer region, the node conductor and the cap all comprise doped polysilicon.

13. The method of claim 11 wherein:

the substrate comprises a doped silicon chip and the buffer region, the node conductor and the cap all comprise doped polysilicon, and each of the lower and upper diffusion barrier layer are composed of a material selected from the group consisting of TiN and WN.

14. The method of claim 11 including:

the substrate comprises a doped silicon chip and the buffer region, the node conductor and the cap all comprise doped polysilicon, forming each of the lower and upper diffusion barrier layers of a material selected from the group consisting of TiN and WN, forming a blanket thin film of the upper diffusion barrier covering the node conductor and the upper portion of the isolation collar, forming a silicon oxide layer on the horizontal surfaces of the upper diffusion barrier including the portion above the node conductor, and etching away the vertical surfaces of the upper diffusion layer.

15. The method of claim 14 including forming the silicon oxide layer by a method selected from the group consisting of the steps as follows:

a) forming HDP oxide in an anisotropic deposition of a horizontal layer, and
b) forming a recessed mandrel above the upper diffusion barrier.

16. The method of claim 11 including:
the substrate comprises a doped silicon chip and the buffer region, the node conductor and the cap all comprise doped polysilicon,
forming each of the lower and upper diffusion barrier layers of a material selected from the group consisting of TiN and WN,
forming a blanket thin film of the upper diffusion barrier covering the node conductor and the upper portion of the isolation collar,
forming a silicon oxide layer on the horizontal surfaces of the upper diffusion barrier including the portion above the node conductor,
etching away the vertical surfaces of the upper diffusion layer,
forming the cap on the surface of the upper diffusion layer.

17. The method of claim 11 including:
the substrate comprises a doped silicon chip and the buffer region, the node conductor and the cap all comprise doped polysilicon,
forming each of the lower and upper diffusion barrier layers of a material selected from the group consisting of TiN and WN,
forming a blanket thin film of the upper diffusion barrier covering the node conductor and the upper portion of the isolation collar,
forming a silicon oxide layer on the horizontal surfaces of the upper diffusion barrier including the portion above the node conductor,
etching away the vertical surfaces of the upper diffusion layer,
forming a very thin layer of silicon nitride on the exposed surfaces of the sidewalls,
forming the cap on the surface of the upper diffusion layer in contact with the very thin layer of silicon nitride.

18. The method of claim 11 including:
forming pad mask over the substrate with an opening for etching the trench,
forming the trench etching through the opening, and
forming the isolation collar to the top of the pad mask.

19. The method of claim 11 including:
forming pad mask over the substrate with an opening for etching the trench,
forming the trench etching through the opening, and
forming the isolation collar to the top of the substrate,
forming the buffer region and the lower diffusion layer,
forming the node conductor and recessing the node conductor,
forming sidewall spacers alongside the isolation collar above the node conductor,
forming the upper diffusion barrier as a blanket layer,
masking the horizontal surfaces of the upper diffusion barrier and etching away the vertical portions of the upper diffusion barrier,
stripping away the sidewall spacers,
depositing and recessing the cap layer, and
etching away exposed portions of the upper diffusion barrier.

20. The method of claim 1 including:
forming the capacitor in a P-well,
forming the plate by doping with N+ dopant,
forming the buffer region as a thin polysilicon layer doped with N+ dopant,
forming the node conductor of polysilicon doped with P type dopant, and
forming the cap of N+ doped polysilicon.

21. The method of claim 11 including:
the substrate comprises a doped silicon chip and the buffer region, the bulk inner electrode and the cap all comprise doped polysilicon,
forming each of the lower and upper diffusion barrier layers of a material selected from the group consisting of TiN and WN,
forming a blanket thin film of the upper diffusion barrier covering the node conductor and the upper portion of the isolation collar,
forming a silicon oxide layer on the horizontal surfaces of the upper diffusion barrier including the portion above the bulk inner electrode, and
etching away the vertical surfaces of the upper diffusion layer.

22. The method of claim 21 including forming the silicon oxide layer by a method selected from the group consisting of the step of
a) forming HDP oxide in an anisotropic deposition of a horizontal layer, and
b) forming a recessed mandrel above the upper diffusion barrier.

23. A method of forming a deep trench capacitor in a deep trench with an open top, sidewalls and a bottom formed in a semiconductor substrate which is doped with a dopant of a first polarity, comprising:
forming a thin film isolation collar of a dielectric material recessed below the top and the above bottom, with confronting sides of the isolation collar formed along the sidewalls of the trench in a space between the top and the bottom of the deep trench,
forming a counterdoped plate electrode region of the substrate surrounding the trench below the isolation collar by counterdoping the plate electrode region through the sidewalls and the bottom with a dopant of the opposite polarity,
forming a capacitor node dielectric for the capacitor below the collar on the sidewalls and bottom of the deep trench, thereby covering exposed surfaces of the plate electrode,
forming a buffer on the surface of the node dielectric comprising counterdoped polysilicon,
forming a conductive, lower diffusion barrier layer over the buffer,
forming a counterdoped bulk inner electrode composed of polysilicon over the lower diffusion barrier layer,
forming a conductive, tipper diffusion barrier layer over the bulk inner electrode reaching between confronting sides of the isolation collar,
forming a counterdoped polysilicon cap on the surface of the conductive, upper diffusion barrier layer with a strap formed on the periphery thereof, and
forming a counterdoped strap region by diffusion of dopant of the opposite polarity into a region in the substrate on the periphery of the polysilicon cap, whereby the counterdoped buffer layer is composed of polysilicon doped with a dopant matching the polarity of the outer electrode thereby providing a work function which closely matches the work function of the outer electrode, thus allowing a plate bias of 0.75V with a zero to 1.5V swing on the bulk inner electrode for minimized stress on the node dielectric layer without degrading the vertical parasitic threshold voltage VT.

24. The method of claim 23 wherein the substrate is a doped silicon chip and the buffer region, the bulk inner electrode and the cap all comprise doped polysilicon.

25. The method of claim 23 wherein:
the substrate comprises a doped silicon chip and the buffer region, the plate electrode and the cap all comprise doped polysilicon, and
each of the lower and upper diffusion barrier layer are composed of a material selected from the group consisting of TiN and WN.

26. The method of claim 23 including:
the substrate comprises a doped silicon chip and the buffer region, the bulk inner electrode and the cap all comprise doped polysilicon,
forming each of the lower and upper diffusion barrier layers of a material selected from the group consisting of TiN and WN,
forming a blanket thin film of the upper diffusion barrier covering the bulk inner electrode and the upper portion of the isolation collar,
forming a silicon oxide layer on the horizontal surfaces of the upper diffusion barrier including the portion above the bulk inner electrode,
etching away the vertical surfaces of the upper diffusion layer,
forming the cap on the surface of the upper diffusion layer.

27. The method of claim 23 including:
the substrate comprises a doped silicon chip and the buffer region, the bulk inner electrode and the cap all comprise doped polysilicon,
forming each of the lower and upper diffusion barrier layers of a material selected from the group consisting of TiN and WN,
forming a blanket thin film of the upper diffusion barrier covering the bulk inner electrode and the upper portion of the isolation collar,
forming a silicon oxide layer on the horizontal surfaces of the upper diffusion barrier including the portion above the bulk inner electrode,
etching away the vertical surfaces of the upper diffusion layer,
forming a very thin layer of silicon nitride on the exposed surfaces of the sidewalls,
forming the cap on the surface of the upper diffusion layer in contact with the very thin layer of silicon nitride.

28. The method of claim 23 including:
forming pad mask over the substrate with an opening for etching the trench,
forming the trench etching through the opening, and
forming the isolation collar to the top of the pad mask.

29. The method of claim 23 including:
forming pad mask over the substrate with an opening for etching the trench,
forming the trench etching through the opening, and
forming the isolation collar to the top of the substrate,
forming the buffer region and the lower diffusion layer,
forming the bulk inner electrode and recessing the plate electrode,
forming sidewall spacers alongside the isolation collar above the bulk inner electrode,
forming the upper diffusion barrier as a blanket layer,
masking the horizontal surfaces of the upper diffusion barrier and etching away the vertical portions of the upper diffusion barrier,
stripping away the sidewall spacers,
depositing and recessing the cap layer, and
etching away exposed portions of the upper diffusion barrier.

30. The method of claim 23 including:
forming the capacitor in a P-well,
forming the plate by doping with N+ dopant,
forming the buffer region as a thin N+ doped layer of polysilicon,
forming the node conductor of polysilicon doped with P type dopant, and
forming the cap of N+ doped polysilicon.

31. A deep trench capacitor formed in an open top trench with sidewalls, and a bottom in a substrate doped with a dopant of a first polarity, comprising:
a counterdoped plate electrode region formed in the substrate surrounding the trench near the bottom formed by doping through sidewalls of the trench,
a node dielectric for the capacitor formed on trench sidewalls,
a counterdoped conductive buffer formed covering the node dielectric
a conductive, lower diffusion barrier layer formed over the buffer,
a node conductor formed on the surface of the lower diffusion barrier layer, the node conductor being doped with a dopant of the first polarity,
a conductive, upper diffusion barrier layer formed over the node conductor,
a counterdoped conductive cap formed on the surface of the upper diffusion barrier layer doped with a dopant of the opposite polarity, and
a counterdoped strap region formed by outdiffusion of dopant of the opposite polarity into a region in the substrate.

32. The capacitor of claim 31 wherein the substrate comprises a doped silicon chip and the buffer region, the node conductor and the cap all comprise counterdoped polysilicon.

33. The capacitor of claim 31 wherein:
the substrate comprises a doped silicon chip and the buffer region, the node conductor and the cap all comprise counterdoped polysilicon, and
each of the lower and upper diffusion barrier layer are composed of a material selected from the group consisting of TiN and WN.

34. The capacitor of claim 31 including:
the substrate comprises a doped silicon chip and the buffer region, the node conductor and the cap all comprise counterdoped polysilicon, and
each of the lower and upper diffusion barrier layers of a material selected from the group consisting of TiN and WN.

35. The capacitor of claim 31 including:
the substrate comprises a silicon chip with a doped well near the surface,
the buffer region, the node conductor and the cap comprise counterdoped polysilicon, and
each of the lower and upper diffusion barrier layers of a material selected from the group consisting of TiN and WN.

36. The capacitor of claim 31 including:
the substrate comprises a doped silicon chip and the buffer region, the node conductor and the cap all comprise counterdoped polysilicon,
each of the lower and upper diffusion barrier layers of a material selected from the group consisting of TiN and WN,
a thin film of the upper diffusion barrier covering the node conductor, and
the cap formed on the surface of the upper diffusion layer in contact with the very thin layer of silicon nitride.

37. The capacitor of claim 31 including the capacitor being formed in a P-well, the plate being doped with N+ dopant, the buffer region comprising a thin polysilicon layer doped with N+ dopant, the node conductor being formed of polysilicon doped with P type dopant, and the cap being formed of N+ doped polysilicon.

38. A deep trench capacitor formed in an open top trench with sidewalls, and a bottom in a substrate doped with a dopant of a first polarity, comprising:
a dielectric isolation collar formed on the sidewalls in a space between the top and the bottom recessed below the top and spaced away from the bottom,
a counterdoped plate electrode region formed in the substrate surrounding the trench below the isolation collar by counterdoping the plate electrode region through the sidewalls and the bottom with a dopant of the opposite polarity,
a capacitor node dielectric formed covering exposed sidewalls below the isolation collar,
a counterdoped conductive buffer formed covering the node dielectric,
a conductive, lower diffusion barrier layer covering the buffer,
a node conductor on the surface of the lower diffusion barrier layer, the node conductor being doped with a dopant of the first polarity,
a conductive, upper diffusion barrier layer over the node conductor reaching between surfaces of the isolation collar,
a counterdoped conductive cap over the conductive, upper diffusion barrier layer, and
a counterdoped outdiffusion strap region formed by diffusion of dopant of the opposite polarity into a region in the substrate juxtaposed with the periphery of the conductive cap.

39. The capacitor of claim 38 wherein the substrate comprises a doped chip and the buffer region, node conductor and cap comprise counterdoped polysilicon.

40. The capacitor of claim 38 wherein:
the substrate comprises a silicon chip with a doped region formed therein,
the buffer region, node conductor and cap are counterdoped polysilicon, and
each of the lower and upper diffusion barrier layer are composed of a material selected from the group consisting of TiN and WN.

41. The capacitor of claim 38 including:
the substrate comprises a silicon chip with a doped well,
the buffer region, the node conductor and the cap all comprise counterdoped polysilicon,
each of the lower and upper diffusion barrier layers of a material selected from the group consisting of TiN and WN, and
a thin film of the upper diffusion barrier covering the node conductor.

42. The capacitor of claim 38 including:
the substrate comprises a doped silicon chip and the buffer region, the node conductor and the cap all comprise doped polysilicon,
each of the lower and upper diffusion barrier layers is composed of a material selected from the group consisting of TiN and WN,
a thin film of the upper diffusion barrier covering the node conductor and the upper portion of the isolation collar.

43. The capacitor of claim 38 including:
the substrate comprises a doped silicon chip and the buffer region, the node conductor and the cap all comprise doped polysilicon,
each of the lower and upper diffusion barrier layers of a material selected from the group consisting of TiN and WN,
a thin film of the upper diffusion barrier covering the node conductor,
a very thin layer of silicon nitride on the exposed surfaces of the sidewalls, and
the cap on the surface of the upper diffusion layer in contact with the very thin layer of silicon nitride.

44. The capacitor of claim 38 including:
the capacitor being formed in a P-well,
the plate being doped with N+ dopant,
the buffer region comprising a thin polysilicon layer doped with N+ dopant,
the node conductor of polysilicon being doped with P type dopant, and
the cap being composed of N+ doped polysilicon.

45. A deep trench capacitor formed in a deep trench with an open top, sidewalls and a bottom formed in a semiconductor substrate which is doped with a dopant of a first polarity, comprising:
a thin film isolation collar of a dielectric material recessed below the top and above the bottom, with confronting sides of the isolation collar formed along the sidewalls of the trench in a space between the top and the bottom of the deep trench,
a counterdoped plate electrode region formed in the substrate surrounding the trench below the isolation collar by counterdoping the plate electrode region through the sidewalls and the bottom with a dopant of the opposite polarity,
a capacitor node dielectric for the capacitor formed below the collar on the sidewalls and the bottom of the deep trench thereby covering surfaces of the plate electrode,
a buffer formed on the surface of the node dielectric comprising counterdoped polysilicon,
a conductive, lower diffusion barrier layer formed over the buffer,
a counterdoped bulk inner electrode composed of polysilicon formed over the lower diffusion barrier layer,
a conductive, upper diffusion barrier layer over the bulk inner electrode reaching between confronting sides of the isolation collar, a counterdoped polysilicon cap formed on the surface of the conductive, upper diffusion barrier layer with a strap formed on the periphery thereof, and a counterdoped strap outdiffusion region formed by diffusion of dopant of the opposite polarity into a region in the substrate on the periphery of the polysilicon cap, whereby the counterdoped buffer layer is composed of polysilicon doped with a dopant matching the polarity of the outer electrode thereby providing a work function which closely matches the work function of the outer electrode, thus allowing a plate bias of 0.75V with a zero to 1.5V swing on the bulk inner electrode for minimized stress on the node dielectric layer without degrading the vertical parasitic threshold voltage VT.

46. The capacitor of claim 45 wherein the substrate comprises a doped silicon chip and the buffer region, the bulk inner electrode and the cap all comprise counterdoped polysilicon.

47. The capacitor of claim 45 wherein:

the substrate comprises a doped silicon chip and the buffer region, the plate electrode and the cap all comprise doped polysilicon, and each of the lower and upper diffusion barrier layer are composed of a material selected from the group consisting of TiN and WN.

48. The capacitor of claim 45 including:

the substrate comprises a doped silicon chip ,and the buffer region, the bulk inner electrode and the cap all comprise counterdoped polysilicon, each of the lower and upper diffusion barrier layers of a material selected from the group consisting of TiN and WN, and a thin film of the upper diffusion barrier covering the node conductor.

49. The capacitor of claim 45 including:

the substrate comprises a doped silicon chip and the buffer region, the bulk inner electrode and the cap all comprise doped polysilicon, each of the lower and upper diffusion barrier layers of a material selected from the group consisting of TiN and WN, thin film upper diffusion barrier covers the bulk inner electrode, and the cap is formed on the surface of the upper diffusion layer .

50. The capacitor of claim 45 including:

the substrate comprises a doped silicon chip, the buffer region, the bulk inner electrode and the cap all comprise counterdoped polysilicon, each of the lower and upper diffusion barrier layers is composed of a material selected from the group consisting of TiN and WN, a thin film of the upper diffusion barrier covers the bulk inner electrode, a very thin layer of silicon nitride covers the sidewalls above the isolation collar, the cap on the surface of the upper diffusion layer is in contact with the very thin layer of silicon nitride.

51. The capacitor of claim 45 including:

the capacitor being formed in a P-well, the plate being doped with N+ dopant, the buffer region as a thin layer of polysilicon doped with N+ dopant, the node conductor of polysilicon doped with P type dopant, and the cap of N+ doped polysilicon.

* * * * *